US011935622B2

United States Patent
Mittal et al.

(10) Patent No.: US 11,935,622 B2
(45) Date of Patent: Mar. 19, 2024

(54) FREE FLOW DATA PATH ARCHITECTURES

(71) Applicant: SanDisk Technologies LLC, Addison, TX (US)

(72) Inventors: Sajal Mittal, Bangalore (IN); Sneha Bhatia, Bangalore (IN)

(73) Assignee: SANDISK TECHNOLOGIES LLC, Addison, TX (US)

( * ) Notice: Subject to any disclaimer, the term of this patent is extended or adjusted under 35 U.S.C. 154(b) by 148 days.

(21) Appl. No.: 17/725,441

(22) Filed: Apr. 20, 2022

(65) Prior Publication Data

US 2023/0343377 A1 Oct. 26, 2023

(51) Int. Cl.
*G11C 7/10* (2006.01)
*G11C 7/22* (2006.01)

(52) U.S. Cl.
CPC ............ *G11C 7/222* (2013.01); *G11C 7/1012* (2013.01); *G11C 7/1039* (2013.01); *G11C 7/1057* (2013.01); *G11C 7/1084* (2013.01)

(58) Field of Classification Search
CPC ..... G11C 7/222; G11C 7/1012; G11C 7/1039; G11C 7/1057; G11C 7/1084
USPC ...................................................... 365/233.1
See application file for complete search history.

(56) References Cited

U.S. PATENT DOCUMENTS

| | | | |
|---|---|---|---|
| 8,930,739 B2 | 1/2015 | Kim | |
| 9,411,722 B2 | 8/2016 | Yap | |
| 9,952,784 B2 * | 4/2018 | Sathyanarayan | ..... G06F 11/167 |
| 10,191,665 B2 | 1/2019 | Chae | |
| 10,241,938 B1 | 3/2019 | Sim | |
| 10,254,967 B2 | 4/2019 | Ouyang | |
| 11,107,512 B2 | 8/2021 | Jeong | |
| 2018/0350445 A1 * | 12/2018 | Linnen | ..................... G11C 7/22 |

FOREIGN PATENT DOCUMENTS

CN 102110461 B * 7/2014

* cited by examiner

*Primary Examiner* — Ly D Pham
(74) *Attorney, Agent, or Firm* — Hector A. Agdeppa; SHEPPARD, MULLIN, RICHTER & HAMPTON LLP

(57) ABSTRACT

A data path architecture and corresponding method of operation are disclosed that permit a first-in-first out (FIFO) buffer to immediately flush data—including potentially invalid initial byte(s)—upon receipt of a high-speed clock signal, and according to which, a delay difference between a data path clock signal and a high-speed clock signal is compensated for at a controller side by, for example, adjusting RE latency to discard/ignore the initially invalid bytes rather than by modifying FIFO depth or varying a number of delay stages in the high-speed clock signal path in order to satisfy the FIFO depth. Because FIFO depth is not used to absorb the clock signal delay difference, there is no need to modify the architecture (e.g., change the depth of a FIFO) to accommodate variation in the clock signal delay difference across different products/product generations, thereby providing high scalability.

20 Claims, 16 Drawing Sheets

FREE FLOW DATA PATH ARCHITECTURES

DESCRIPTION OF RELATED ART

Semiconductor memory is widely used in various electronic devices, such as cellular telephones, digital cameras, personal digital assistants, medical electronics, mobile and non-mobile computing devices, vehicles, and so forth. Semiconductor memory may include non-volatile memory and/or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Semiconductor memory architecture designs, as they relate, for example, to signaling, components, input/outputs (I/O), or the like, may employ different hardware configurations for different use cases, project generations, product lines, and the like. For example, different products provide different capabilities with respect to memory storage capacity, read/write speed, and so forth. As such, these different products may employ different architectures that utilize different combinations/configuration of hardware components (e.g., different amounts/sizes of memory arrays, varying numbers of I/O, etc.). In some cases, the different architectures may be employed to account for different component types and/or different component parameters across generations of a product.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
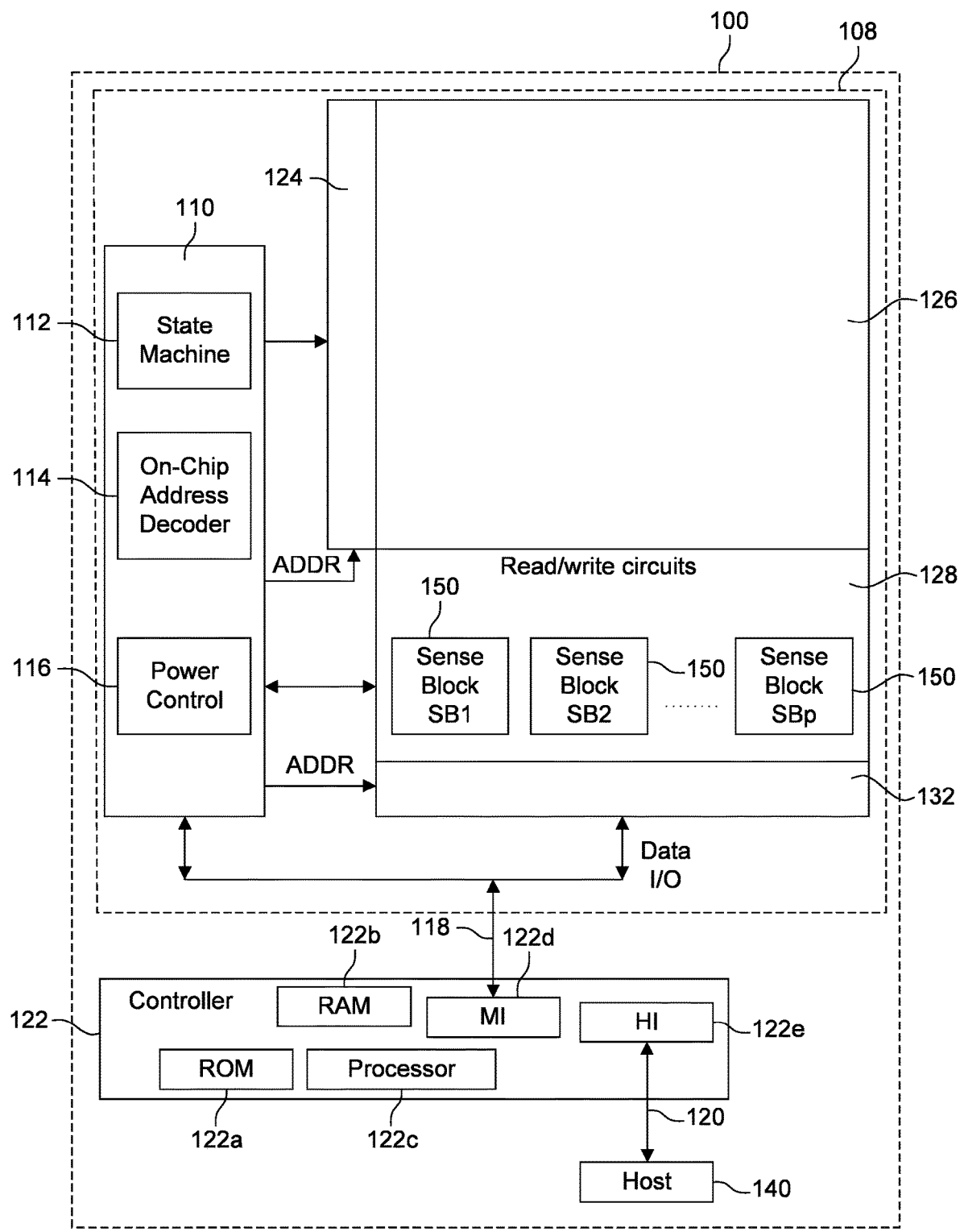
FIG. 1 is a block diagram of an example memory device, in connection with which, example embodiments of the disclosed technology can be implemented.

The figures are not exhaustive and do not limit the present disclosure to the precise form disclosed.

DETAILED DESCRIPTION

NAND-type (and similar) flash memories (also referred to herein as flash memories) may be designed to have scalable components and features. Such scalability can reduce the cost, time, and other constraints associated with production of new flash memories. However, certain aspects or components of the flash memories may not be easily scalable. For example, flash memory data path architectures may not be scalable across different generations of flash memory, which may have different speeds of operation, such as different toggle mode speeds. This lack of scalability may manifest itself in various ways such as in the inability to account for variation in clock signal delay differences without modifying the underlying physical hardware of the data path architecture. Moreover, modifications made to the data path architecture to accommodate variation in the delay difference between a data path clock signal and a high-speed clock signal, such as modifying FIFO depth and/or modifying the number of delay stages in the high-speed clock signal path not only impact scalability, but can also have other detrimental impacts such as increasing clock jitter and increasing short circuit currents.

Embodiments of the disclosed technology are directed to a data path architecture and corresponding method of operation that solves the technical problems of lack of scalability, increased clock jitter, and increased energy that are associated with existing data path architectures. In particular, a data path architecture according to embodiments of the disclosed technology does not compensate for a delay difference between a data path clock signal and a high-speed clock signal by modifying FIFO depth or by varying a number of delay stages in the high-speed clock signal path to satisfy the FIFO depth (as existing data path architectures do), but rather permits a FIFO to immediately flush data, including potentially invalid initial byte(s), upon receipt of the high-speed clock signal, and instead accounts for the delay difference between the data path clock signal and the high-speed clock signal at a controller by, for example, adjusting RE latency to discard/ignore the initially invalid bytes. As such, because the FIFO depth is not used to absorb the clock signal delay difference in data path architectures according to embodiments of the disclosed technology, there is no need to modify the architecture in any way (e.g., change the depth of a FIFO) to accommodate variation in the clock signal delay difference across different products/product generations. Thus, the FIFO depth can be fixed, and as a result, there is no need to introduce a variable amount of delay to the high-speed clock signal to account for changes to the FIFO depth, as would be required in existing data path architectures. As a result, the improved data path architectures disclosed herein are scalable across different products/product generations and do not suffer from the technical problems of increased clock jitter and increased short circuit currents that existing data path architectures do owing to the need to modify hardware blocks in existing data path architectures to compensate for the clock signal delay difference.

FIGS. 1 to 4G depict an example memory system that can be used to implement the technology disclosed herein. FIG. 1 is a functional block diagram of an example memory system 100. The components depicted in FIG. 1 are electrical circuits. Memory system 100 includes one or more memory dies 108, referred to hereinafter in the singular for ease of explanation. The memory die 108 can be a complete memory die or a partial memory die. In one embodiment, each memory die 108 includes a memory structure 126, control circuitry 110, and read/write circuits 128. Memory structure 126 is addressable by wordlines via a row decoder 124 and by bitlines via a column decoder 132. The read/write/erase circuits 128 include multiple sense blocks 150 including SB1, SB2, . . . , SBp (sensing circuitry) and allow a page of memory cells to be read or programmed in parallel. Also, many strings of memory cells can be erased in parallel.

In some systems, a controller 122 is included in the same package (e.g., a removable storage card) as the memory die 108. However, in other systems, the controller can be separated from the memory die 108. In some embodiments the controller is on a different die than the memory die 108. In some embodiments, one controller 122 communicates with multiple memory dies 108. In other embodiments, each memory die 108 has its own controller. Commands and data are transferred between a host 140 and controller 122 via a data bus 120, and between controller 122 and the memory die 108 via lines 118. In one embodiment, memory die 108 includes a set of input and/or output (I/O) pins that connect to lines 118.

Control circuitry 110 cooperates with the read/write circuits 128 to perform memory operations (e.g., write, read, erase) on memory structure 126, and includes state machine 112, an on-chip address decoder 114, and a power control circuit 116. In one embodiment, control circuitry 110 includes buffers such as registers, read-only memory (ROM) fuses and other storage devices for storing default values such as base voltages and other parameters.

The on-chip address decoder 114 provides an address interface between addresses used by host 140 or controller 122 and the hardware address used by the decoders 124 and 132. Power control circuit 116 controls the power and voltages supplied to the wordlines, bitlines, and select lines during memory operations. The power control circuit 116 includes voltage circuitry, in one embodiment. Power control circuit 116 may include charge pumps for creating voltages. The sense blocks 150 include bitline drivers. The power control circuit 116 executes under control of the state machine 112, in one embodiment.

State machine 112 and/or controller 122 (or equivalently functioned circuits), in combination with all or a subset of the other circuits depicted in FIG. 1, can be considered a control circuit that performs the functions described herein. Such a control circuit can include hardware only or a combination of hardware and software (including firmware). For example, a controller programmed by firmware to perform the functions described herein is one example of a control circuit. A control circuit can include a processor, a PGA (Programmable Gate Array), an FPGA (Field Programmable Gate Array), an ASIC (Application Specific Integrated Circuit), or another type of integrated circuit or circuit more generally.

The (on-chip or off-chip) controller 122 (which in one embodiment is an electrical circuit) may comprise one or more processors 122c, ROM 122a, random access memory (RAM) 122b, a memory interface (MI) 122d, and a host interface (HI) 122e, all of which may be interconnected. The storage devices (ROM 122a, RAM 122b) store code (software) such as a set of instructions (including firmware), and one or more of the processors 122c are operable to execute the set of instructions to provide functionality described herein. Alternatively or additionally, one or more processors 122c can access code from a storage device in the memory structure, such as a reserved area of memory cells connected to one or more wordlines. RAM 122b can be used to store data for controller 122, including caching program data (discussed below). MI 122d—in communication with ROM 122a, RAM 122b, and processor(s) 122c— may be an electrical circuit that provides an electrical interface between controller 122 and memory die 108. For example, MI 122d can change the format or timing of signals, provide a buffer, isolate from surges, latch I/O, etc. One or more processors 122c can issue commands to control circuitry 110 (or another component of memory die 108) via MI 122d. Host interface 122e provides an electrical interface with host 140 via data bus 120 in order to receive commands, addresses and/or data from host 140 to provide data and/or status to host 140.

In one embodiment, memory structure 126 comprises a three-dimensional (3D) memory array of non-volatile memory cells in which multiple memory levels are formed above a single substrate, such as a wafer. The memory structure may comprise any type of non-volatile memory monolithically formed in one or more physical levels of arrays of memory cells having an active area disposed above a silicon (or other type of) substrate. In one example, the non-volatile memory cells comprise vertical NAND strings with charge-trapping material. In another embodiment, memory structure 126 comprises a two-dimensional (2D) memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include resistive random access memory (ReRAM) memories, magnetoresistive RAM (MRAM) memory (e.g., MRAM, Spin Transfer Torque MRAM, Spin Orbit Torque MRAM), phase change memory (PCM), and the like. Examples of suitable technologies for memory cell architectures of the memory structure 126 include 2D arrays, 3D arrays, cross-point arrays, stacked 2D arrays, vertical bitline arrays, and the like.

Cross point memory—one example of a ReRAM or PCM RAM—includes reversible resistance-switching elements arranged in cross point arrays accessed by X lines and Y lines (e.g., wordlines and bitlines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one that is relatively inert (e.g., tungsten) and the other of which is electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

MRAM stores data within magnetic storage elements. The magnetic storage elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device can be built from a grid of such memory cells. In one embodiment for programming, each memory cell lies between a pair of write lines arranged at right angles to each other, parallel to the cell, one above and one below the cell. When current is passed through them, an induced magnetic field is created.

PCM exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). As such, the programming doses are laser pulses. The memory cells can be inhibited by blocking the memory cells from receiving the light. Note that the use of "pulse" in this document does not require a square pulse, but also includes a continuous (or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 2:
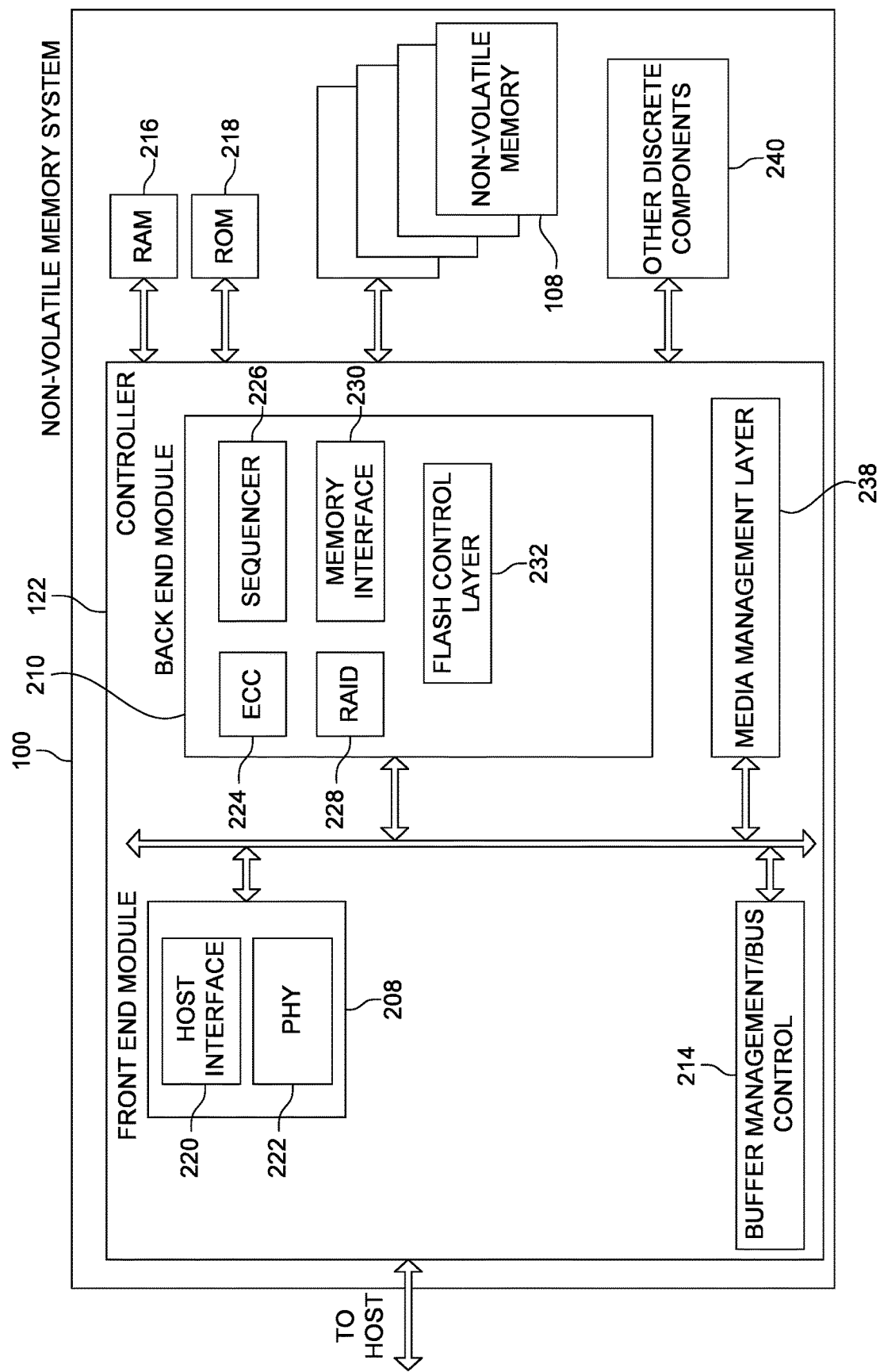
FIG. 2 is a block diagram of an example memory system, in connection with which, example embodiments of the disclosed technology can be implemented.

FIG. 2 is a block diagram of example memory system 100 that depicts more details of one embodiment of controller 122. While the controller 122 in the embodiment of FIG. 2 is a flash memory controller, it should be appreciated that non-volatile memory 108 is not limited to flash memory. Thus, the controller 122 is not limited to the particular example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In an example operation, when a host needs to read data from or write data to the flash memory, it will communicate with the flash memory controller. If the host provides a logical address to which data is to be read/written, the flash memory controller can convert the logical address received from the host to a physical address in the flash memory. Alternatively, the host itself can provide the physical address. The flash memory controller can also perform various memory management functions including, but not limited to, wear leveling (distributing writes to avoid wearing out specific blocks of memory that would otherwise be repeatedly written to) and garbage collection (after a block is full, moving only the valid pages of data to a new block, so that the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other examples, memory system 100 can be a solid state drive (SSD).

In some embodiments, non-volatile memory system 100 includes a single channel between controller 122 and non-volatile memory die 108. However, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if only a single channel is shown in the drawings.

As depicted in FIG. 2, controller 122 includes a front-end module 208 that interfaces with a host, a back-end module 210 that interfaces with the memory die 108, and various other modules that perform functions which will now be described in detail. The components of controller 122 depicted in FIG. 2 may take various forms including, without limitation, a packaged functional hardware unit (e.g., an electrical circuit) designed for use with other components, a portion of a program code (e.g., software or firmware) executable by a (micro) processor or processing circuitry that usually performs a particular function of related functions, a self-contained hardware or software component that interfaces with a larger system, or the like. For example, each module may include an ASIC, an FPGA, a circuit, a digital logic circuit, an analog circuit, a combination of discrete circuits, gates, or any other type of hardware or combination thereof. Alternatively or additionally, each module may include software stored in a processor readable device (e.g., memory) to program a processor to enable controller 122 to perform the functions described herein. The architecture depicted in FIG. 2 is one example implementation that may (or may not) use the components of controller 122 depicted in FIG. 1 (e.g., RAM, ROM, processor, interface).

Referring again to modules of the controller 122, a buffer manager/bus control 214 manages buffers in RAM 216 and controls the internal bus arbitration of controller 122. ROM 218 stores system boot code. Although illustrated in FIG. 2 as located separately from the controller 122, in other embodiments, one or both of RAM 216 and ROM 218 may be located within the controller. In yet other embodiments, portions of RAM 216 and ROM 218 may be located within the controller 122, while other portions may be located outside the controller. Further, in some implementations, the controller 122, RAM 216, and ROM 218 may be located on separate semiconductor dies.

Front-end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back-end module 210 includes an error correction code (ECC) engine 224 that encodes the data bytes received from the host, and decodes and error corrects the data bytes read from the non-volatile memory 108. A command sequencer 226 generates command sequences, such as program and erase command sequences, to be transmitted to non-volatile memory 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as one or more extra dies, or may be added within the existing die, e.g., as an extra plane, an extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back-end module 210.

Additional components of system 100 illustrated in FIG. 2 include media management layer (MML) 238, which performs wear leveling of memory cells of non-volatile memory die 108, as well as, other discrete components 240, such as external electrical interfaces, external RAM, resistors, capacitors, or other components that may interface with controller 122. In alternative embodiments, one or more of the physical layer interface 222, RAID module 228, MML 238, or buffer management/bus controller 214 are optional components.

MML 238 (e.g., Flash Translation Layer (FTL)) may be integrated as part of the flash management for handling flash errors and interfacing with the host. In particular, MML 238 may be a module in flash management and may be responsible for the internals of NAND management. In particular, MML 238 may include an algorithm in the memory device firmware which translates writes from the host into writes to the memory 126 of die 108. MML 238 may be needed because: 1) the memory 126 may have limited endurance; 2) the memory 126 may only be written in multiples of pages; and/or 3) the memory 126 may not be written unless it is erased as a block (or a tier within a block in some embodiments). MML 238 understands these potential limitations of the memory 126 which may not be visible to the host. Accordingly, MML 238 attempts to translate the writes from host into writes into the memory 126.

Controller 122 may interface with one or more memory dies 108. In one embodiment, controller 122 and multiple memory dies (together comprising non-volatile storage system 100) implement an SSD, which can emulate, replace, or be used in place of a hard disk drive inside a host, as a network access storage (NAS) device, in a laptop, in a tablet, in a server, etc. Additionally, the SSD need not be made to work as a hard drive.

Some embodiments of the non-volatile storage system 100 may include one memory die 108 connected to one controller 122. Other embodiments may include multiple memory dies 108 in communication with one or more controllers 122. In one example, the multiple memory dies 108 can be grouped into a set of memory packages. Each memory package may include one or more memory dies 108 in communication with controller 122. In one embodiment, a memory package includes a printed circuit board (or similar structure) with one or more memory dies 108 mounted thereon. In some embodiments, a memory package can include molding material to encase the memory dies 108 of the memory package. In some embodiments, controller 122 is physically separate from any of the memory packages.

Figure 3:
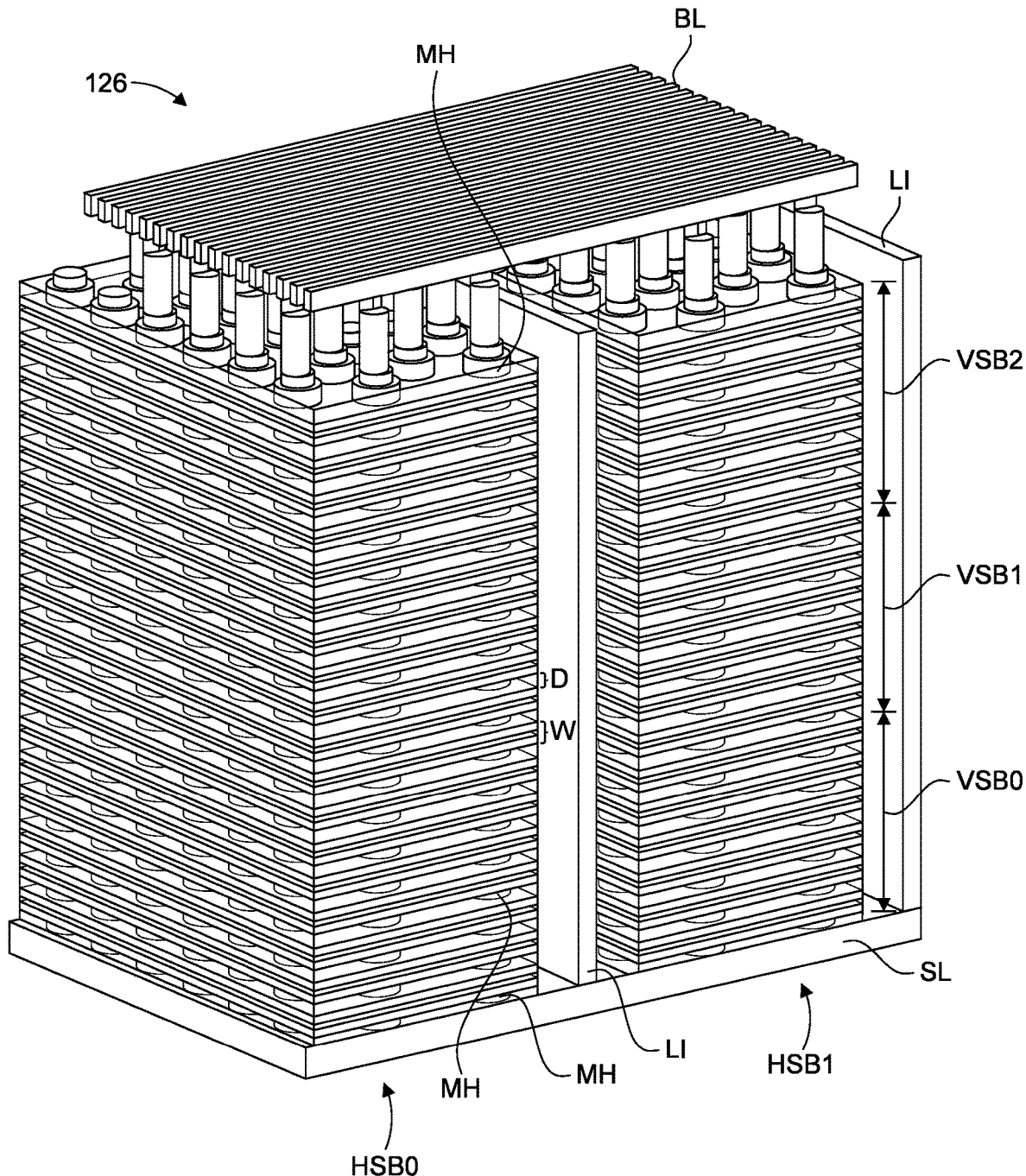
FIG. 3 is a perspective view of a portion of an example monolithic three-dimensional memory structure, in connection with which, example embodiments of the disclosed technology can be implemented.

FIG. 3 is a perspective view of a portion of a monolithic 3D memory array that includes a plurality of non-volatile memory cells, and that can comprise memory structure 126 in one embodiment. FIG. 3 illustrates, for example, a portion of one block of memory. The structure depicted includes a set of bitlines (BLs) positioned above a stack of alternating dielectric layers and conductive layers. For example purposes, one of the dielectric layers is marked as D and one of the conductive layers (also called wordline layers) is marked as W. The number of alternating dielectric and conductive layers can vary based on specific implementation requirements. In some embodiments, the 3D memory array includes between 108-300 alternating dielectric and conductive layers. One example embodiment includes 96 data wordline layers, 8 select layers, 6 dummy wordline layers, and 110 dielectric layers. More or less than 108-300 layers can also be used. Data wordline layers include data memory cells. Dummy wordline layers include dummy memory cells. As will be explained below, the alternating dielectric and conductive layers are divided into four "fingers" by local interconnects LI. FIG. 3 shows two fingers and two local interconnects LI. Below the alternating dielectric layers and wordline layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the 3D monolithic memory array that may comprise memory structure 126 is provided below with respect to FIGS. 4A-4H.

One of the local interconnects LI separates the block into two horizontal sub-blocks HSB0, HSB1. The block comprises multiple vertical sub-blocks VSB0, VSB1, VSB2. The vertical sub-blocks VSB0, VSB1, VSB2 can also be referred to as "tiers." Each vertical sub-block extends across the block, in one embodiment. Each horizontal sub-block HSB0, HSB1 in the block is a part of vertical sub-block VSB0. Likewise, each horizontal sub-block HSB0, HSB1 in the block is a part of vertical sub-block VSB1. Likewise, each horizontal sub-block HSB0, HSB1 in the block is a part of vertical sub-block VSB2. For ease of explanation, vertical sub-block VSB0 will be referred to as a lower vertical sub-block, vertical sub-block VSB1 will be referred to as a middle vertical sub-block, and VSB2 will be referred to as an upper vertical sub-block. In one embodiment, there are two vertical sub-blocks in a block. In other embodiments, there could be four or more vertical sub-blocks in a block.

A memory operation for a vertical sub-block may be performed on memory cells in one or more horizontal sub-blocks. For example, a programming operation of memory cells in vertical sub-block VSB0 may include: programming memory cells in horizontal sub-block HSB0 but not horizontal sub-block HSB1; programming memory cells in horizontal sub-block HSB1 but not horizontal sub-block HSB0; or programming memory cells in both horizontal sub-block HSB0 and horizontal sub-block HSB1.

The different vertical sub-blocks VSB0, VSB1, VSB2 are treated as separate units for erase/program purposes, in one embodiment. For example, the memory cells in one vertical sub-block can be erased while leaving valid data in the other vertical sub-blocks. Then, memory cells in the erased vertical sub-block can be programmed while valid data remains in the other vertical sub-blocks. In some cases, memory cells in the middle vertical sub-block VSB1 are programmed while there is valid data in the lower vertical sub-block VSB0 and/or the upper vertical sub-block VSB2. Programming the memory cells in middle vertical sub-block VSB1 may present challenges due to the valid data in the other vertical sub-blocks VSB0, VSB2.

Figure 4A:
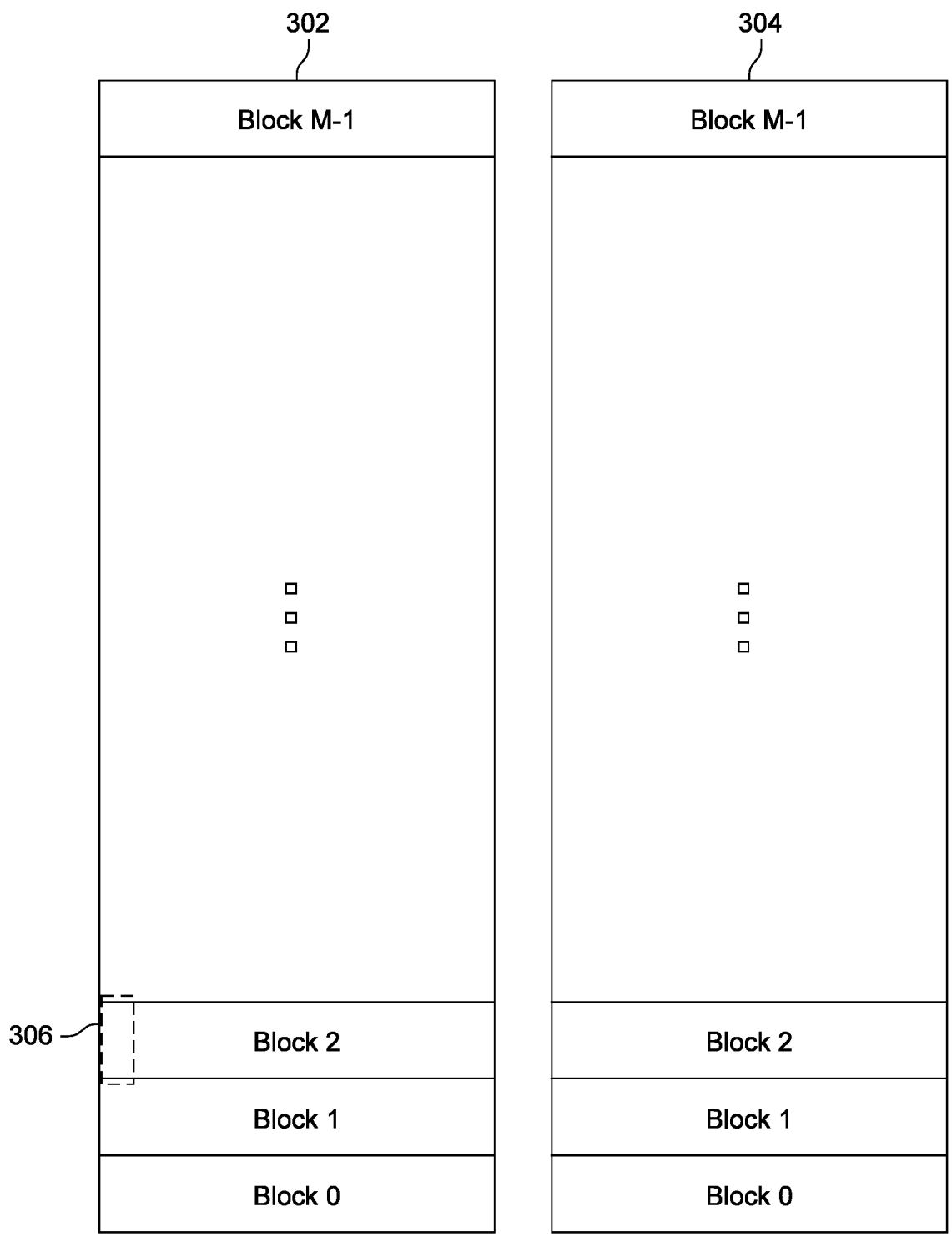
FIG. 4A is a block diagram of an example memory structure having two planes, in connection with which, example embodiments of the disclosed technology can be implemented.

FIG. 4A is a block diagram depicting one example organization of memory structure 126, which is divided into two planes 302 and 304. Each plane is then divided into M blocks. In one example, each plane has about 2000 blocks. However, different numbers of blocks and planes can also be used. In one embodiment, a block of memory cells constitutes a single unit for an erase operation. That is, in one embodiment, all memory cells of a block are erased together. In other embodiments, memory cells can be grouped into blocks for other reasons, such as to organize the memory structure 126 to enable the signaling and selection circuits. In some embodiments, a block represents a groups of connected memory cells that share a common set of wordlines.

Figure 4B:
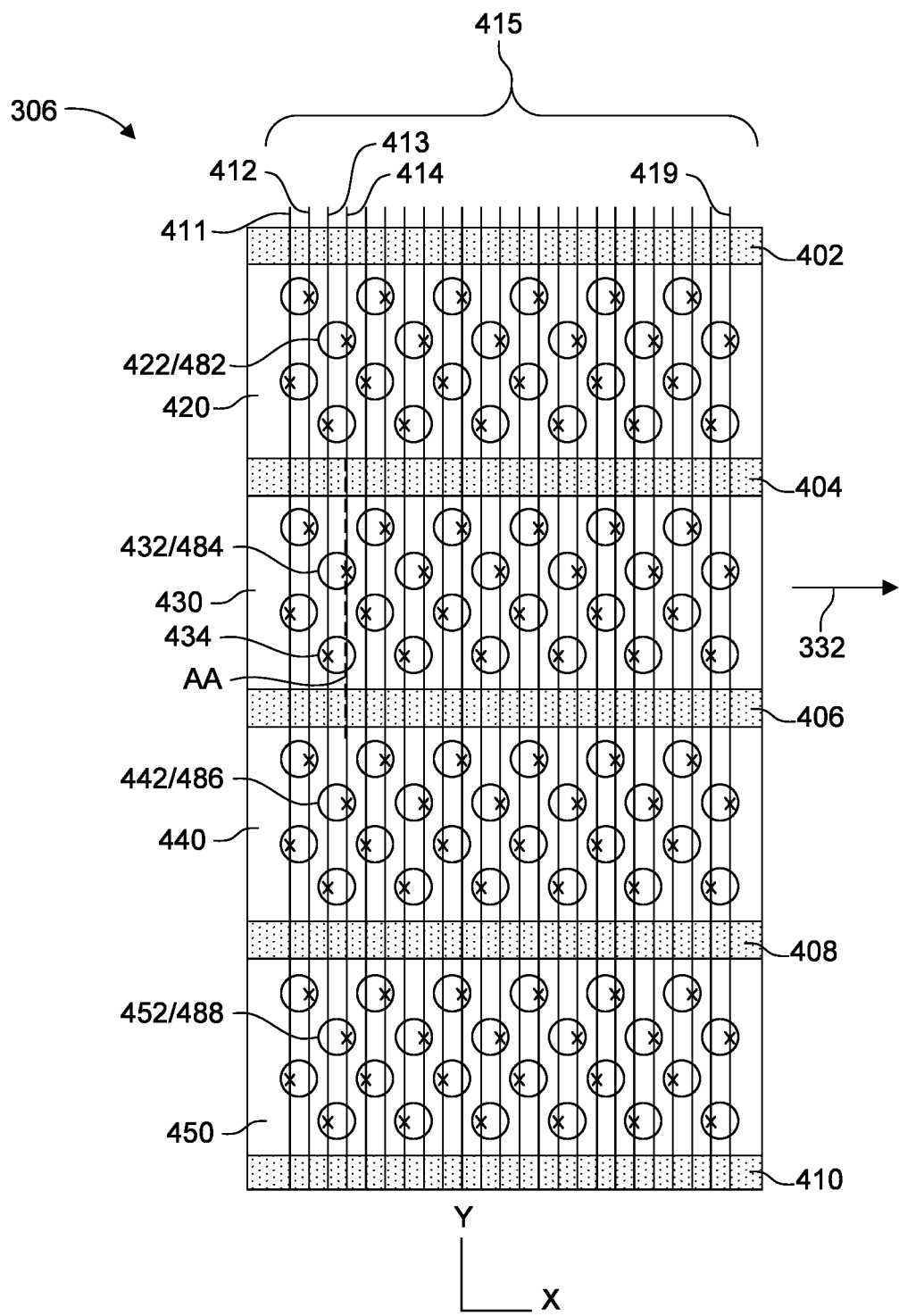
FIG. 4B depicts a top view of a portion of a block of example memory cells, in connection with which, example embodiments of the disclosed technology can be implemented.

FIGS. 4B-4F depict an example 3D NAND structure that corresponds to the structure of FIG. 3 and that can be used to implement memory structure 126 of FIG. 2. Although the example memory system of FIGS. 3-4H is a 3D memory structure that includes vertical NAND strings with charge-trapping material, it should be appreciated that other (2D and 3D) memory structures can also be used with the technology described herein. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. While in some embodiments, the memory array may have many layers, FIG. 4B illustrates only the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bitlines 415, including bitlines 411, 412, 413, 414, . . . 419. FIG. 4B shows twenty-four bitlines because only a portion of the block is depicted. It is contemplated that more than twenty-four bitlines connected to vertical columns of the block. Each of the circles representing vertical columns has an "x" to indicate its connection to one bitline. For example, bitline 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as wordline fingers that are separated by the local interconnects. In one embodiment, the wordline fingers on a common level of a block connect together to form a single wordline. In another embodiment, the wordline fingers on the same level are not connected together. In one example implementation, a bitline only connects to one vertical column in each of regions 420, 430, 440 and 450. In that implementation, each block has sixteen rows of active columns and each bitline connects to four rows in each block. In one embodiment, all of the four rows connected to a common bitline are connected to the same wordline (via different wordline fingers on the same level that are connected together), in which case, the system uses the source side selection lines and the drain side selection lines to choose one (or another subset) of the four to be subjected to a memory operation (program, verify, read, and/or erase).

Although FIG. 4B shows four regions and sixteen rows of vertical columns in a block, with each region having four rows of vertical columns, those exact numbers are an example implementation. Other embodiments may include more or less regions per block, more or less rows of vertical columns per region, and/or more or less rows of vertical columns per block. FIG. 4B also shows the vertical columns being staggered. In other embodiments, different patterns of staggering can be used. In some embodiments, the vertical columns may not be staggered.

Figure 4C:
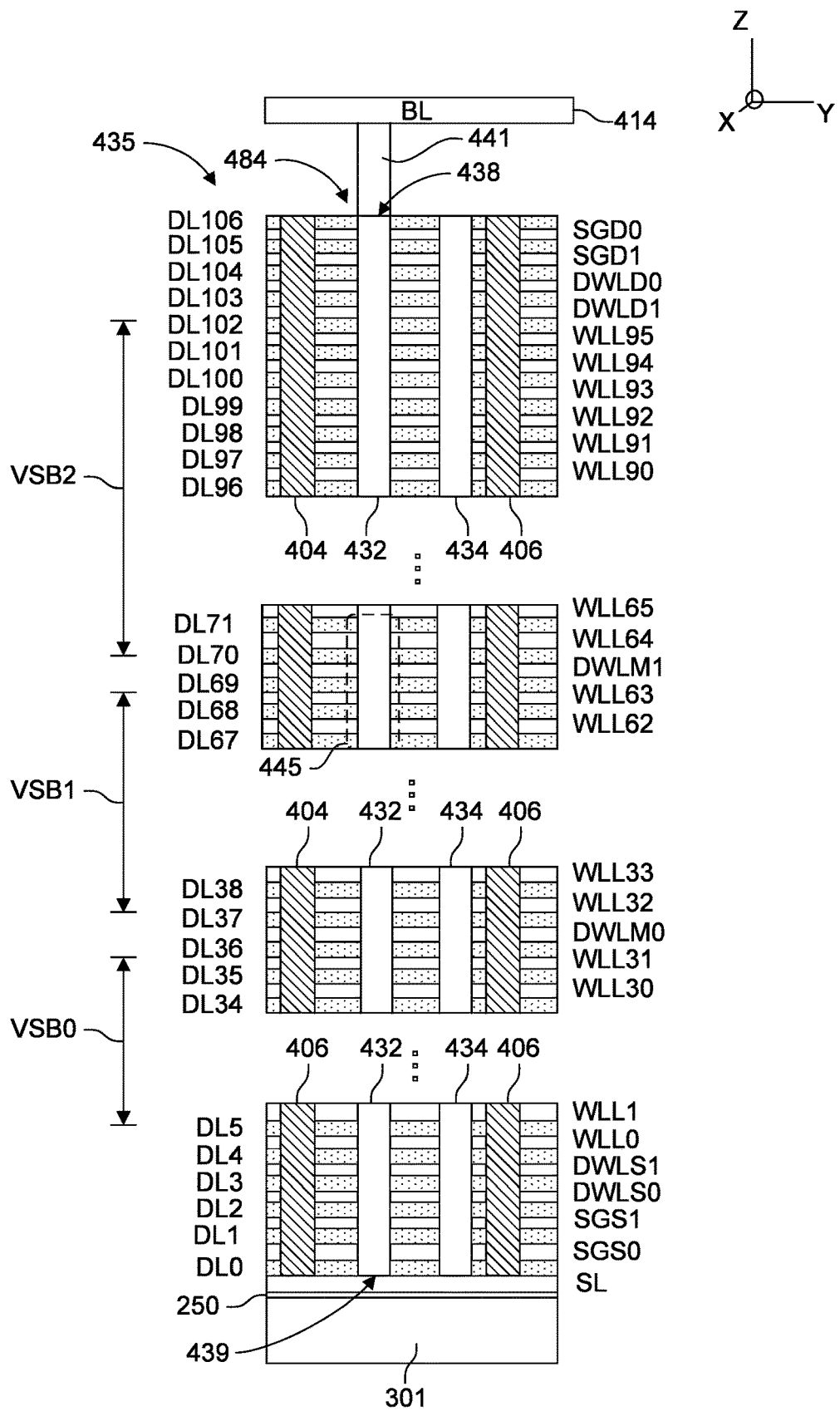
FIG. 4C depicts a stack showing a cross-sectional view along line AA of FIG. 4B.

FIG. 4C depicts an embodiment of a stack 435 showing a cross-sectional view along line AA of FIG. 4B. Two SGD layers (SGD0, SDG1), two SGS layers (SGS0, SGS1) and six dummy wordline layers DWLD0, DWLD1, DWLM1, DWLM0, DWLS0 and DWLS1 are provided, in addition to the data wordline layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 301, an insulating film 250 on the substrate, and a portion of a source line SL. A portion of the bitline 414 is also depicted. Note that NAND string 484 is connected to the bitline 414.

NAND string 484 has a source-end 439 at a bottom of the stack and a drain-end 438 at a top of the stack. The source-end 439 is connected to the source line SL. A conductive via 441 connects the drain-end 438 of NAND string 484 to the bitline 414. The metal-filled slits 404 and 406 from FIG. 4B are also depicted.

The stack 435 is divided into three vertical sub-blocks (VSB0, VSB1, VSB2). Vertical sub-block VSB0 includes WLL0-WLL31. Layers SGS0, SGS1, DWLS0, DWLS1 could also be considered to be a part of vertical sub-block VSB0. Vertical sub-block VSB1 includes WLL32-WLL63. Layers SGD0, SGD1, DWLD0, DWLD1 could also be considered to be a part of vertical sub-block VSB2. Vertical sub-block VSB2 includes WLL64-WLL95. Each NAND string has a set of data memory cells in each of the vertical sub-blocks. Dummy wordline layer DMLM0 is between vertical sub-block VSB0 and vertical sub-block VSB1. Dummy wordline layer DMLM1 is between vertical sub-block VSB1 and vertical sub-block VSB2. The dummy wordline layers have dummy memory cell transistors that may be used to electrically isolate a first set of memory cell transistors within the memory string (e.g., corresponding to vertical sub-block VSB0 wordlines WLL0-WLL31) from a second set of memory cell transistors within the memory string (e.g., corresponding to the vertical sub-block VSB1 wordlines WLL32-WLL63) during a memory operation (e.g., an erase operation or a programming operation).

In another embodiment, one or more middle junction transistor layers are used to divide the stack 435 into vertical sub-blocks. A middle junction transistor layer contains junction transistors, which do not necessarily contain a charge storage region. Hence, a junction transistor is typically not considered to be a dummy memory cell. Both a junction transistor and a dummy memory cell may be referred to herein as a "non-data transistor." A non-data transistor, as the term is used herein, is a transistor on a NAND string, where the transistor is either configured to not store user or system data or operated in such a way that the transistor is not used to store user data or system data. A wordline that is connected to non-data transistors is referred to herein as a non-data wordline. Examples of non-data wordlines include, but are not limited to, dummy wordlines, a select line in a middle junction transistor layer, or the like.

The stack 435 may have more than three vertical sub-blocks. For example, the stack 435 may be divided into four, five, or more vertical sub-blocks. Each of the vertical sub-blocks may contain at least one data memory cell. In some embodiments, additional layers similar to the middle dummy wordline layers DWLM may be provided to divide the stack 435 into the additional vertical sub-blocks. In one embodiment, the stack has two vertical sub-blocks.

Figure 4D:
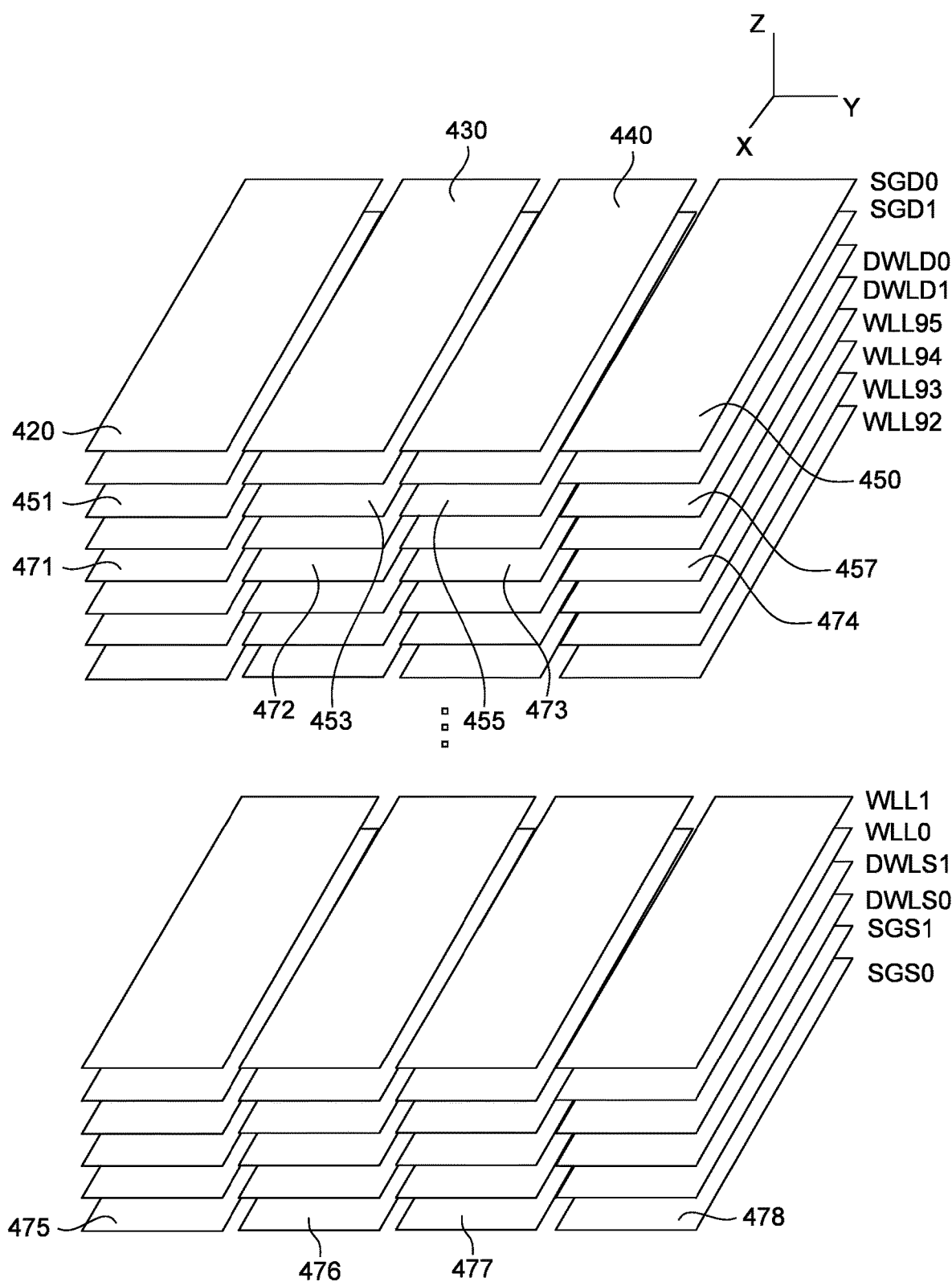
FIG. 4D depicts an alternative view of the select gate layers and wordline layers of the stack 435 of FIG. 4C.

FIG. 4D depicts an alternative view of the SG layers and wordline layers of the stack 435 of FIG. 4C. Each of SGD layers SGD0 and SGD0 (the drain side SG layers) includes parallel rows of SG lines associated with the drain side of a set of NAND strings. For example, SGD0 includes drain side SG regions 420, 430, 440 and 450, consistent with FIG. 4B. Below the SGD layers are the drain side dummy wordline layers. In one implementation, each dummy wordline layer represents a wordline that is connected to a set of dummy memory cells at a given height in the stack. For example, DWLD0 includes wordline layer regions 451, 453, 455 and 457. A dummy memory cell, also referred to herein as a non-data memory cell, does not store data and is ineligible to store data, while a data memory cell is eligible to store data. Moreover, the threshold voltage Vth of a dummy memory cell is generally fixed at the time of manufacture or may be periodically adjusted, while the Vth of the data memory cells changes more frequently, e.g., during erase and programming operations of the data memory cells.

Below the dummy wordline layers are the data wordline layers. For example, WLL95 comprises wordline layer regions 471, 472, 473 and 474. Below the data wordline layers are the source side dummy wordline layers. Below the source side dummy wordline layers are the SGS layers. Each of the SGS layers SGS0 and SGS1 (the source side SG layers) includes parallel rows of SG lines associated with the source side of a set of NAND strings. For example, SGS0 includes source side SG lines 475, 476, 477 and 478. In some embodiments, each SG line is independently controlled, while in other embodiments, the SG lines are connected and commonly controlled.

Figure 4E:
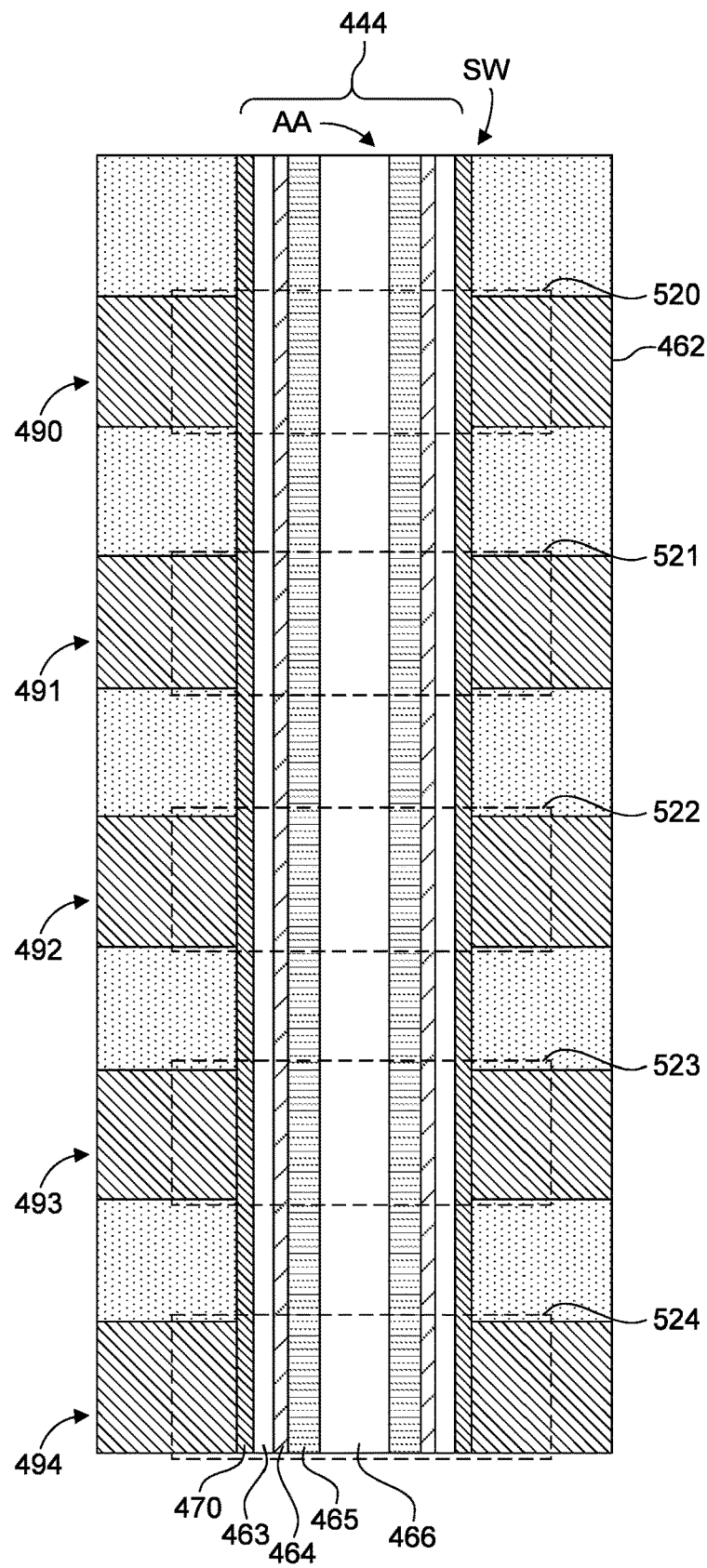
FIG. 4E depicts a view of the region 445 of FIG. 4C.

FIG. 4E depicts a view of the region 445 of FIG. 4C. Data memory cell transistors 520 and 521 are above dummy memory cell transistor 522. Below dummy memory cell transistor 522 are data memory cell transistors 523 and 524. A number of layers can be deposited along the sidewall (SW) of the memory hole 444 and/or within each wordline layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A wordline layer can include a conductive metal 462 such as tungsten as a control gate. For example, control gates 490, 491, 492, 493 and 494 are provided. In this example, all of the layers except the metal are provided in the memory hole. In other approaches, some of the layers may be in the control gate layer. Additional pillars can be similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Non-data transistors (e.g., select transistors, dummy memory cell transistors) may also include the charge trapping layer 463. For example, in FIG. 4E, dummy memory cell transistor 522 includes the charge trapping layer 463. Thus, the Vth of at least some non-data transistors may also be adjusted by storing or removing electrons from the charge trapping layer 463. However, it is not required that all non-data transistors have an adjustable Vth. For example, the charge trapping layer 463 is not required to be present in every select transistor.

Each of the memory holes can be filled with a plurality of annular layers comprising a blocking oxide layer, a charge trapping layer, a tunneling layer, and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4F:
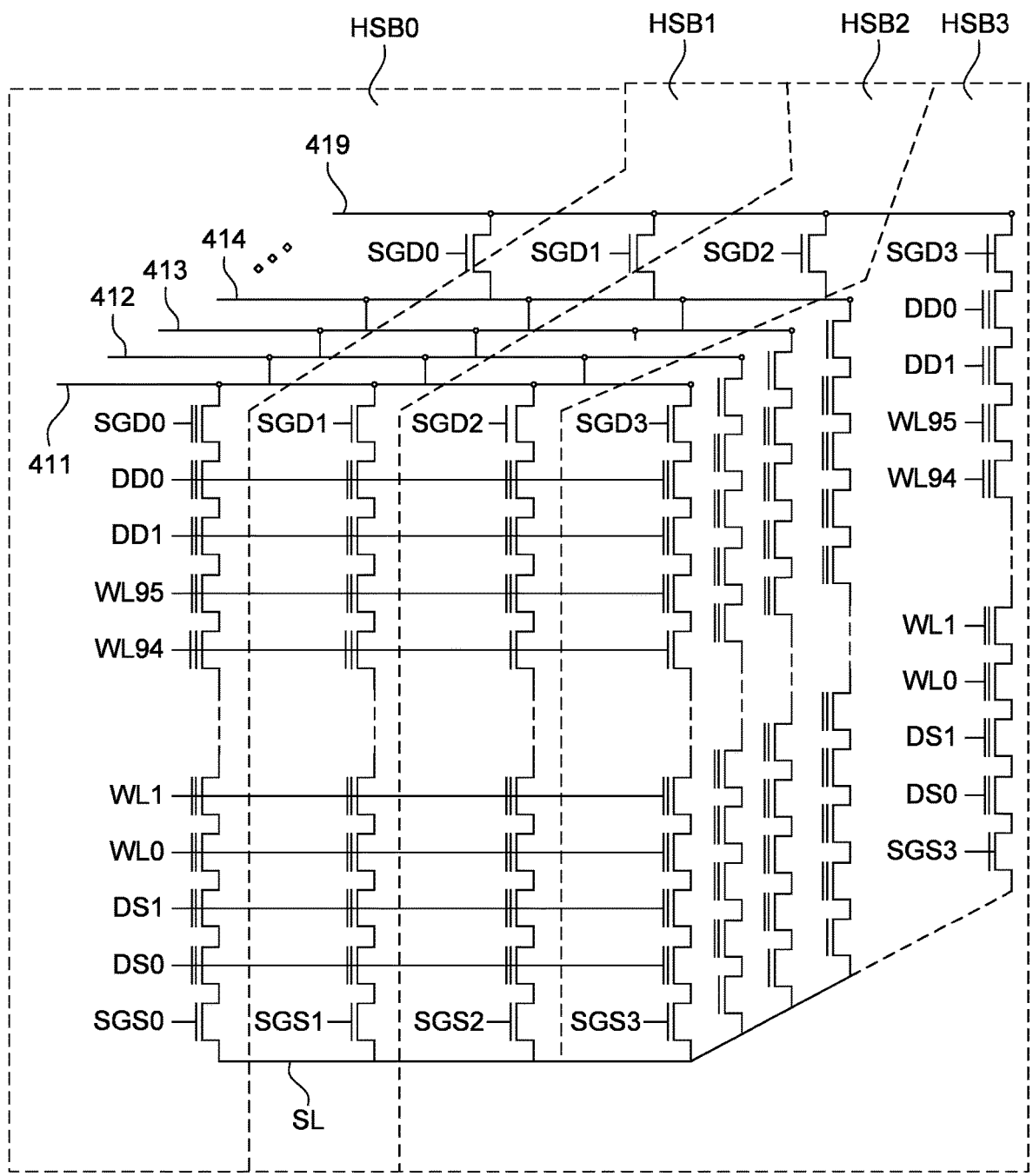
FIG. 4F is a schematic of a plurality of example NAND strings showing multiple horizontal sub-blocks, in connection with which, example embodiments of the disclosed technology can be implemented.

FIG. 4F is a schematic diagram of a portion of the memory depicted in FIGS. 3-4E. FIG. 4F shows physical wordlines WLL0-WLL95 running across the entire block. The structure of FIG. 4F corresponds to portion 306 in Block 2 of FIGS. 4A-E, including bitlines 411, 412, 413, 414, . . .

419. Within the block, each bitline is connected to four NAND strings. Drain side selection lines SGD0, SGD1, SGD2 and SGD3 are used to determine which of the four NAND strings connect to the associated bitline(s). Source side selection lines SGS0, SGS1, SGS2 and SGS3 are used to determine which of the four NAND strings connect to the common source line. The block can also be thought of as divided into four horizontal sub-blocks HSB0, HSB1, HSB2 and HSB3. Horizontal sub-block HSB0 corresponds to those vertical NAND strings controlled by SGD0 and SGS0, horizontal sub-block HSB1 corresponds to those vertical NAND strings controlled by SGD1 and SGS1, horizontal sub-block HSB2 corresponds to those vertical NAND strings controlled by SGD2 and SGS2, and horizontal sub-block HSB3 corresponds to those vertical NAND strings controlled by SGD3 and SGS3.

Figure 4G:
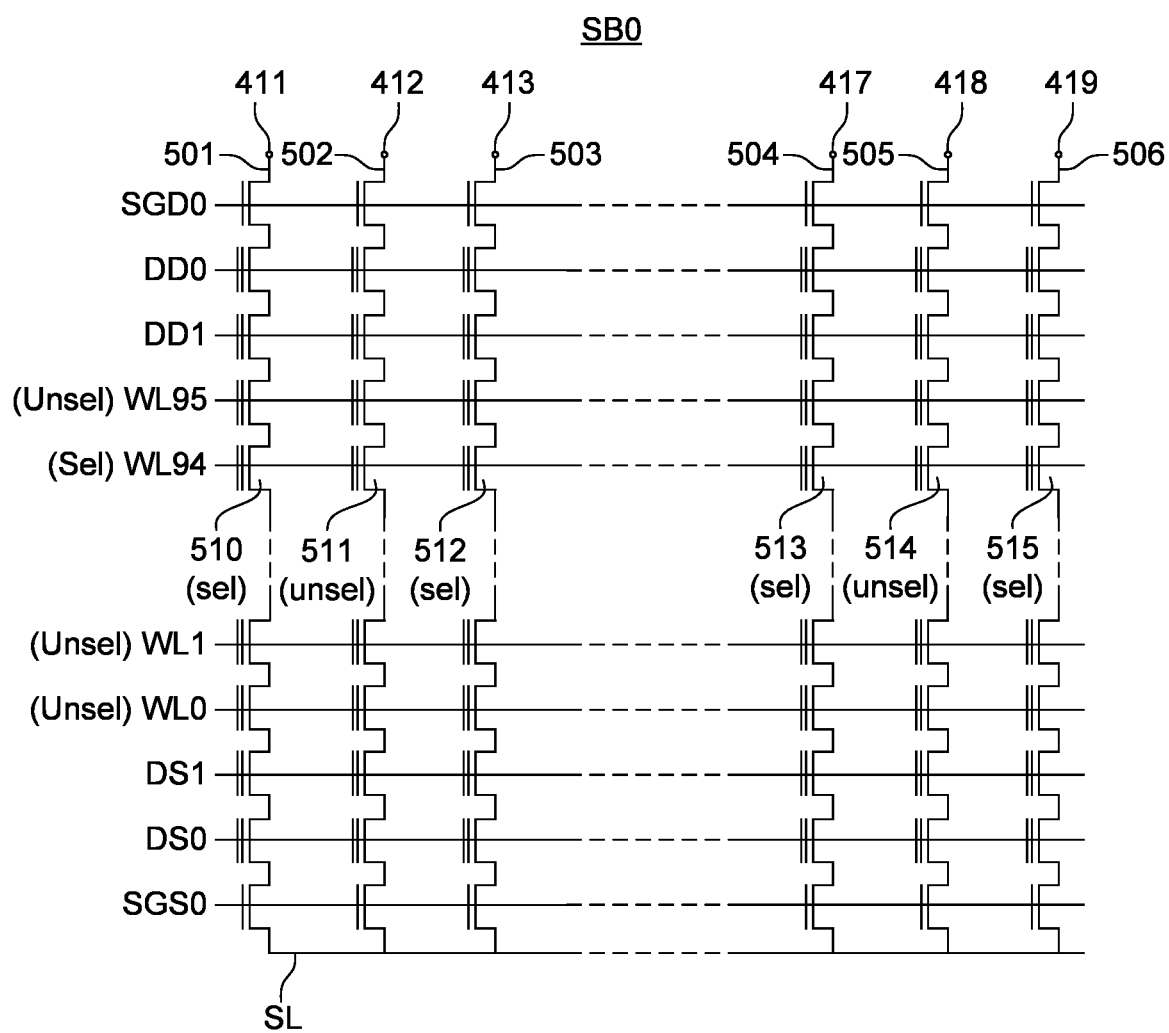
FIG. 4G is a schematic of a plurality of NAND strings showing one example horizontal sub-block, in connection with which, example embodiments of the disclosed technology can be implemented.

FIG. 4G is a schematic of horizontal sub-block HSB0. Horizontal sub-blocks HSB1, HSB2 and HSB3 may have similar structures. FIG. 4G shows physical wordlines WL0-WL95 running across the entire sub-block HSB0. All of the NAND strings of sub-block HSB0 are connected to SGD0 and SGS0. For ease of depiction, FIG. 4G only depicts six NAND strings 501, 502, 503, 504, 505, and 506; however, horizontal sub-block HSB0 may have thousands of NAND strings (e.g., 15,000 or more).

FIG. 4G is being used to explain the concept of a selected memory cell. A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

As an example of selected memory cells and unselected memory cells, during a programming process, the set of memory cells intended to take on a new electrical characteristic (or other characteristic) to reflect a changed programming state are referred to as the selected memory cells, while the memory cells that are not intended to take on a new electrical characteristic (or other characteristic) to reflect a changed programming state are referred to as the unselected memory cells. In certain situations, unselected memory cells may be connected to the same wordline as selected memory cells. Unselected memory cells may also be connected to different wordlines than selected memory cells. Similarly, during a reading process, the set of memory cells to be read are referred to as the selected memory cells, while the memory cells that are not intended to be read are referred to as the unselected memory cells.

To better understand the concept of selected memory cells and unselected memory cells, assume a programming operation is to be performed and, for example purposes only, that wordline WL94 and horizontal sub-block HSB0 are selected for programming (see FIG. 4G). That means that all of the memory cells connected to WL94 that are in horizontal sub-blocks HSB1, HSB2 and HSB3 (the other horizontal sub-blocks) are unselected memory cells. Some of the memory cells connected to WL94 in horizontal sub-block HSB0 are selected memory cells and some of the memory cells connected to WL94 in horizontal sub-block HSB0 are unselected memory cells depending on how the programming operation is performed and the data pattern being programmed. For example, those memory cells that are to remain in the erased state (e.g., state S0) will be unselected memory cells because their programming state will not change in order to store the desired data pattern, while those memory cells that are intended to take on a new electrical characteristic (or other characteristic) to reflect a changed programming state (e.g., programmed to states S1-S7) are selected memory cells. Looking at FIG. 4G, assume for example purposes, that memory cells 511 and 514 (which are connected to wordline WL94) are to remain in the erased state; therefore, memory cells 511 and 514 are unselected memory cells (labeled unset in FIG. 4G). Additionally, assume, for example purposes, that memory cells 510, 512, 513 and 515 (which are connected to wordline WL94) are each to be programmed to a respective one of data states S1-S7; therefore, memory cells 510, 512, 513 and 515 are selected memory cells (labeled sel in FIG. 4G).

Figure 5:
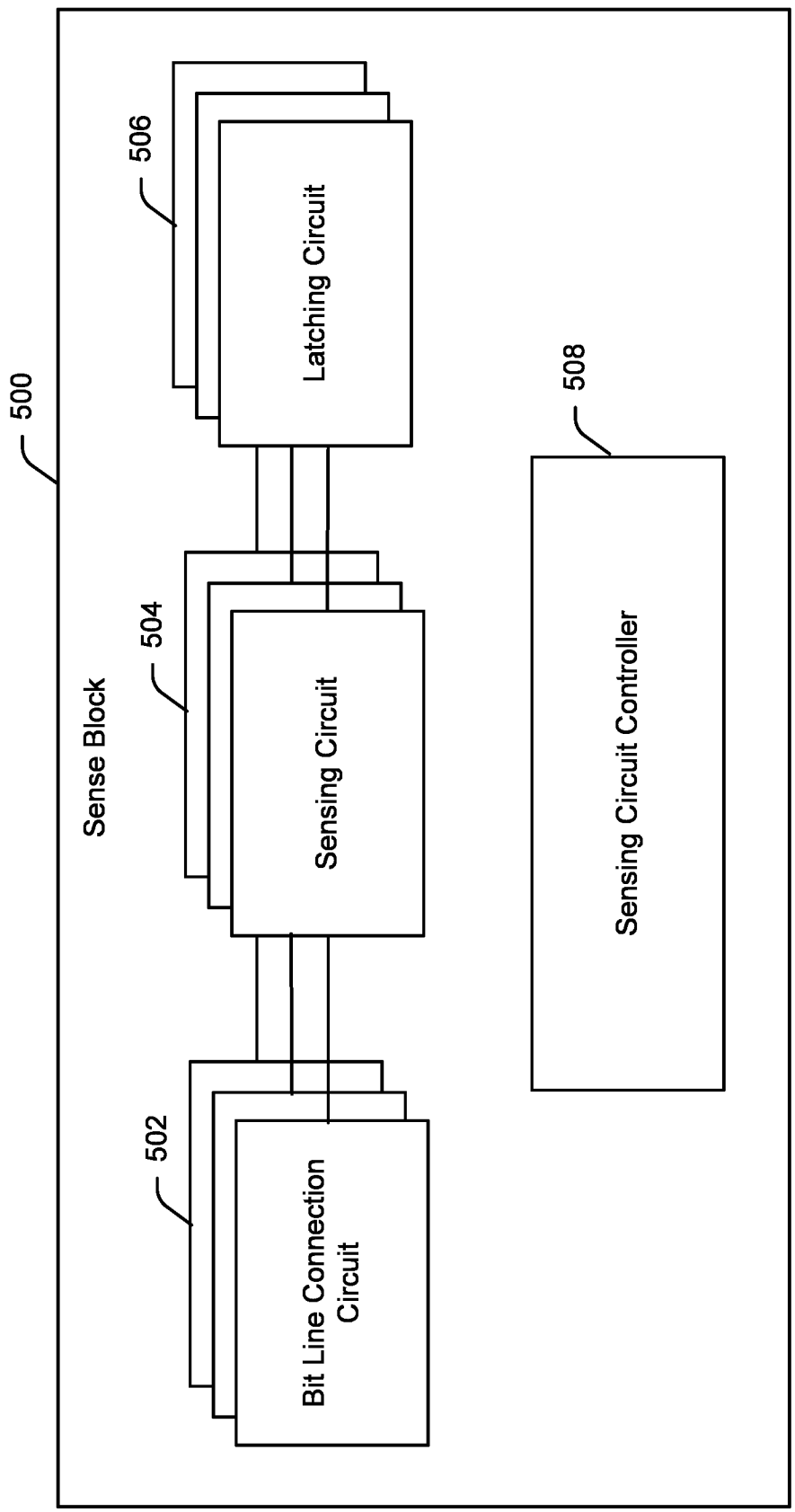
FIG. 5 is a schematic block diagram depicting an example configuration of a sense block of a memory die, in connection with which, example embodiments of the disclosed technology can be implemented.

FIG. 5 is a block diagram of an example configuration of a sense block 500, which may be representative of one of the sense blocks 150 (FIG. 1). The sense block 500 may include a plurality of sense circuits 504 and a plurality of sets of latching circuits 506. For example, there can be 16 k sets of sense circuits 504 and latching circuits 506. In other example embodiments, there can be a set of sense circuits 504 and a respective latching circuit 506 for each memory cell in a memory array, for example. In some embodiments, each sense circuit 504 (which may also include sense amplifier circuitry) may be associated with a respective one of the latching circuits 506. That is, each sense circuit 504 may be configured to communicate with and/or perform a sense operation using data and/or storing data into its associated latching circuit 506.

Additionally, the sense block 500 may include a sense circuit controller 508 that is configured to control operation of the sense circuits 504 (and/or the sets of latches 506) of the sense block 500. As described in further detail below, the sense circuit controller 508 may control operation of the sense circuits 504 and the latches 506 by outputting control signals to terminals of the sense circuits 504 and the latches 506. The sense circuit controller 508 may be implemented in hardware, firmware, software, or combinations thereof. For example, the sense circuit controller 508 may include a processor that executes computer instructions stored in a memory to perform at least some of its functions. Controller 508 can be configured with various modules to perform one or more functions. Each module may include one or more instructions for execution of logic of one or more circuits described herein. For example, instructions may include instructions for generating one or more signals or sensing one or more voltage levels. Instructions may further include instructions for executing any of the steps of any of the methods disclosed herein. The controller 508 may send messages and receive data, including program code, through one or more communication interface(s). The received code may be executed by a processor of the controller 508 as it is received, and/or stored in a storage device, or other nonvolatile storage for later execution.

Sense circuits 504 described herein can be coupled to bitlines and/or wordlines. Bitline connection circuit 502 is depicted in FIG. 5 as part of sense block 500. It should be appreciated, however, that the bitline connection circuit 502 may be, more generally, part of read/write circuit 128. Bitline connection circuit 502 may be configured to electrically connect and disconnect the ith bitline BL(i) from the sensing circuit 504 (and the latching circuit 506). In the case of a 3D NAND architecture, the ith bitline BL(i) may be connected to a respective memory hole from each NAND string of each NAND block of the 3D structure. In the case of a 2D NAND architecture, the ith bitline BL(i) may be connected to an associated NAND string. The ith bitline BL(i) may be one of a plurality bitlines and the NAND string may be one of a plurality of NAND strings included in a memory cell structure of a memory die. The NAND string can include one or more memory cells. For a read operation, a target memory cell can be a memory cell from which data is to be read, and thus, for which a sense operation is performed. For a verification operation, a target memory cell can be a memory cell being programmed in an associated program-verify operation.

When the bitline connection circuitry 502 connects the ith bitline BL(i) to the sensing circuit 504 (e.g. for a sense operation), current may flow from the sense circuit 504 to the ith bitline BL(i). Alternatively, when the bitline connection circuitry 502 disconnects the ith bitline BL(i) from the sense circuit 504, current may be prevented from flowing from the sensing circuit 504 to the ith bitline BL(i). Bitline connection circuit 502 may include a bitline biasing circuit configured to bias the ith bitline BL(i) by generating a bitline bias voltage at a bitline bias node. The amount of the bitline bias voltage may depend on whether the ith bitline BL(i) is a selected bitline or an unselected bitline. In particular, when the ith bitline BL(i) is a selected bitline, the bitline biasing may allow the bitline bias voltage at the high supply voltage level or a level corresponding to the high supply voltage, and when the ith bitline BL(i) is an unselected bitline, the bitline biasing circuit may generate the bitline bias voltage at the cell source voltage level or a level corresponding to the cell source voltage.

Sensing circuits 504 described herein can include a pre-charge circuit path configured to pre-charge one or more sense node(s) with a voltage at a pre-charge level during a sense operation. A latching circuit 506, in response to receiving a control signal at a high voltage level at a first transistor of the latch circuit 506, can enable a pre-charge circuit path to pre-charge the sense node with the voltage at the pre-charge level.

Figure 6:
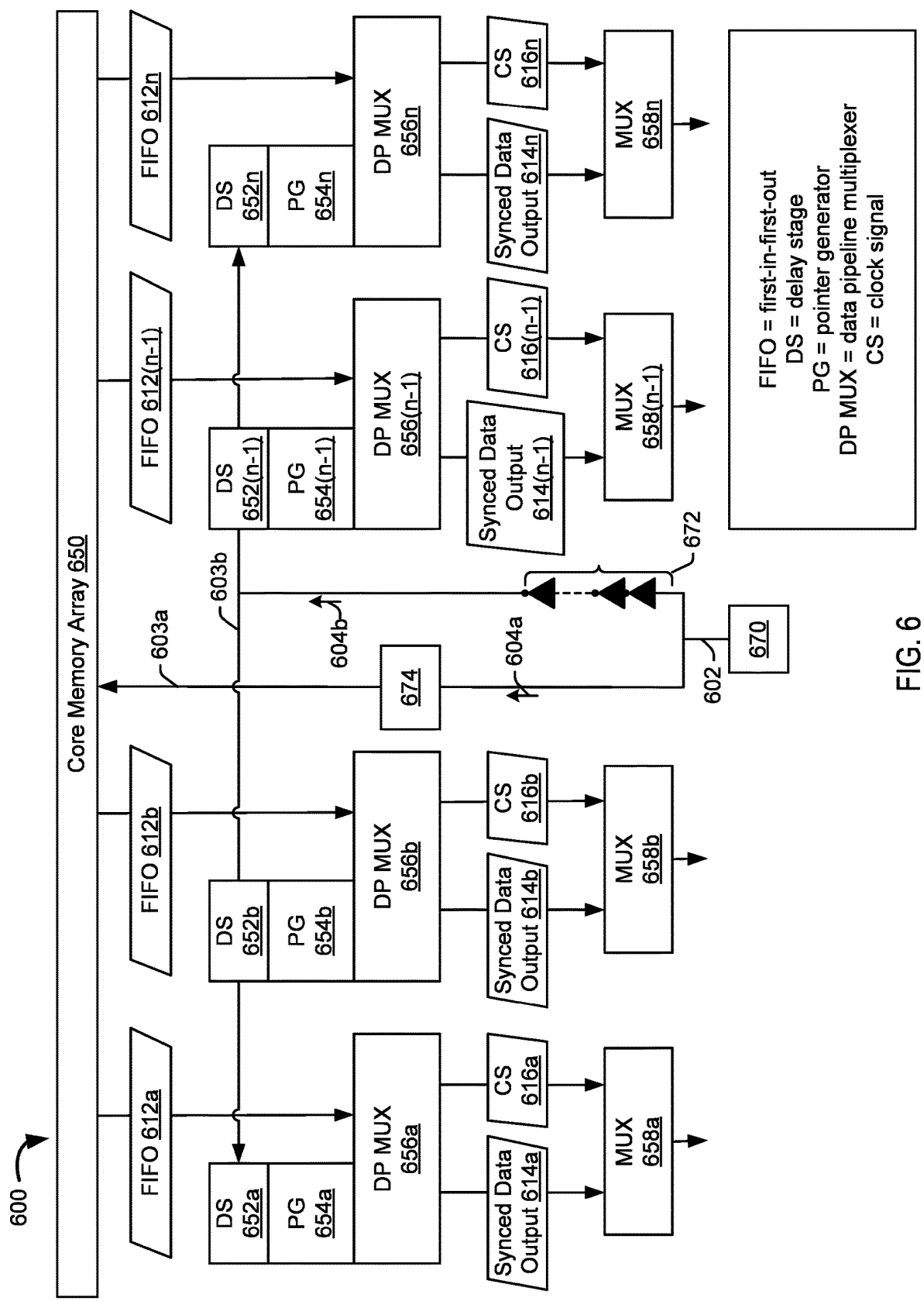
FIG. 6 is a schematic diagram of an example existing data path architecture.

FIG. 6 is a schematic diagram of an existing data path architecture 600 that provides a synchronized output of data stored in a NAND-flash memory array, where the memory array may be implemented, for example, within memory system 100. The synchronized data output may be provided to an I/O interface, for example. The architecture 600 includes a core memory array 650. The memory array core 650 may store data, which may be read from the core 650 and stored in first-in-first-out (FIFO) buffers 612a-612n (at times collectively referred to herein as first FIFO 612a-612n, or more generically, as first FIFO 612). The first FIFO 612a-612n may, for example, constitute a global FIFO.

More specifically, a clock generator 670 such as an read enable (RE) pad or component may generate a clock signal 602. The clock signal 602 may be split into a data path clock signal 603a that travels along a first clock path 604a and a high-speed clock signal 603b that travels along a second clock path 604b. The first FIFO 612a-612n may receive, from the core memory array 650, data that is synchronized with the data path clock signal 603a. In particular, the data path clock signal 603a may read data from the core array 650, and the read data (which is synchronized with the data path clock signal 603a) may be sent to the first FIFO 612a-612n, which in turn, may flush the received data on to data pipeline multiplexers (MUXes) 656a-656n.

The combination of pointer generators 654a-654n and data pipeline MUXes 656a-656n may together constitute FIFO buffers (referred to at times herein as a second FIFO). As noted, the first FIFO 612a-612n receives data that is read from the core memory array 650 and flushes the data—which is synchronized with the data path clock signal 603a—to the data pipeline MUXes 656a-656n. In addition, the high-speed clock signal 603b travelling along the second clock path 604b may be fed to delay stages 652a-652n, and then through to pointer generators 654a-654n. The pointer generators 654a-654n are configured to generate pointers based on the high-speed clock signal 603b, and the pointers may serve as MUXing signals that enable the data pipeline MUXes 656a-656n to select, as synced data outputs 614a-614n, those inputs that are synchronized with respect to the high-speed clock signal 603b, among the multiple inputs received from the first FIFO 612a-612n.

Referring now to the method of operation of the data path architecture 600 in more detail, an RE pad or component 670 may generate an RE input clock signal 602. In other scenarios, another type of clock generator 670 may generate the clock signal 602. As depicted in FIG. 6 and as described earlier, the RE input clock signal 602 may be split into two clock signals—a data path clock signal 603a and a high-speed clock signal 603b that respectively travel along a first clock path 604a and a second clock path 604b. A clock generator 674 may be provided to generate the data path clock signal 603a from the input clock signal 602. In particular, the portion of the input clock signal 602 that is split along the first clock path 604a may be the same high-speed clock signal 603b that travels along the second clock path 604b, until the signal reaches the clock generator 674, at which point, the clock generator 674 may generate the data path clock signal 603a from the high-speed clock signal 603b. Further, the clock generator 674 may be configured to tune the data path clock signal 603a to provide better margin inside the core memory array 650.

A delay difference between the data path clock signal 603a and the time required to read data from the internal latches of the core memory array 650 may be compensated for within a depth of the first FIFO 612a-612n. Moreover, a delay difference between the data path clock signal 603a and the high-speed clock signal 603b may be compensated for within a depth of the second FIFO. In some embodiments, delay stages 672 and delay stages 652a-652n may be provided to introduce delay to the high-speed clock signal 603b. This delay may be introduced to the high-speed clock signal 603b to enable the data pipeline MUXes 656a-656n to synchronize data—that is read out from the core memory array 650 based on the data path clock signal 603a and flushed to the data pipeline MUXes 658a-658n via the FIFOs 612a-612n—with the high-speed clock signal 603b received via the pointer generators 654a-654n.

More specifically, in some cases, the delay difference between the data path clock signal 603a and the high-speed clock signal 603b may be fully compensated for by the depth of the second FIFO. In such scenarios, there may not be a need to introduce delay to the high-speed clock signal 603b. As an example, assume that the depth (e.g., a number of stages) of the second FIFO is X ns, and the delay difference between the data path clock signal 603a and the high-speed clock signal 603b is X ns or less, then in such scenarios, the delay difference may be fully absorbed by the second FIFO depth, in which case, adding delay to the high-speed clock signal 603b may not be needed. In particular, data may be pre-fetched from the core memory array 650 and flushed by the first FIFO 612a-612n into the second FIFO. Then, since in this example the depth of the second FIFO is enough to fully accommodate the delay difference between the data path clock signal 603a and the high-speed clock signal 603b, the data pipeline MUXes 656a-656n can output valid data 614a-614n that is synchronized with the high-speed clock signal 603b based on pointers (e.g., MUXing signals) generated by the pointer generators 654a-654n, without having to introduce delay to the high-speed clock signal 603b. In particular, the data pipeline MUXes 656a-656n may flush the synchronized data output 614a-614n along with the clock signals 616a-616n with which the data output 614a-614n is synchronized. The synced data output 614a-614n and the corresponding clock signals 616a-616n may then be provided as input to downstream MUXes 658a-658n in the data path architecture. An output from the downstream MUXes 658a-658n may then be provided to an I/O interface, for example.

On the other hand, if the depth of the second FIFO is not able to absorb the entirety of the delay difference between the data path clock signal 603a and the high-speed clock signal 603b, then delay may be introduced to the high-speed clock signal 603b to satisfy the depth of the second FIFO, and ensure that valid data 614a-614n is output. The delay may be introduced via delay stages 672 and/or delay stages 652a-652n. In some embodiments, delay stages 672 and delay stages 652a-652n may be provided at various points along the second clock path 604b so that various ones of the delay stages 672 and/or 652a-652n act as signal repeaters to ensure signal integrity of the high-speed clock signal 603b over the second clock path 604b distance. In those scenarios in which delay is introduced to the high-speed clock signal 603b, the clock signals 616a-616n may be delayed versions of the high-speed clock signal 603b.

The existing data path architecture of FIG. 6 suffers from various technical drawbacks. For instance, the delay difference between the data path clock signal 603a and the high-speed clock signal 603b may vary across different products/product generations. In order to accommodate this variance in the delay difference, the depth of the second FIFO needs to be changed, which requires modifications to the physical hardware. As such, the data path architecture of FIG. 6 is not scalable across different products/product generations. For instance, if the delay difference between the data path clock signal 603a and the high-speed clock signal 603b is large, the depth of the second FIFO may need to be increased, which constitutes a change to the data path architecture that can have a detrimental impact on chip footprint. In addition, as previously noted, delay stages may need to be added to the second clock path 604b along which the high-speed clock signal 603b travels in order to satisfy the FIFO depth in those situations in which the FIFO depth may not be enough to fully compensate for the delay difference between the data path clock signal 603a and the high-speed clock signal 603b. These additional delay stages can lead to undesirable clock jitter.

Embodiments of the disclosed technology provide an improved data path architecture and method of operation that solves the above-noted technical problems of the existing data path architecture shown in FIG. 6. In particular, an improved data path architecture according to embodiments of the disclosed technology, such as that depicted in FIG. 7, does not require hardware modifications to the FIFO depth to accommodate variation in the delay difference between the data path clock signal 603a and the high-speed clock signal 603b across different products/product generations. Rather, according to example embodiments of the disclosed technology, the second FIFO is permitted to flush invalid data and the delay difference between the data path clock signal 603a and the high-speed clock signal 603b is compensated for at the controller side by, for example, adjusting the RE latency. In this manner, the improved data path architecture disclosed herein is scalable across different products/product generations having different delay differences between the data path clock signal 603a and the high-speed clock signal 603b. In addition, in the improved data path architecture disclosed herein, delay stages do not need to be introduced in the second clock path 604b of the high-speed clock signal 603b to satisfy FIFO depth because the second FIFO (or more specifically, the data pipeline MUXes 656a-656n) are permitted to immediately flush data (which may potentially include invalid data) upon receipt of the high-speed clock signal 604b, and the delay difference between the clock signals can be accommodated at the controller side to ensure that ultimately only valid data is output from the data path architecture.

Figure 7:
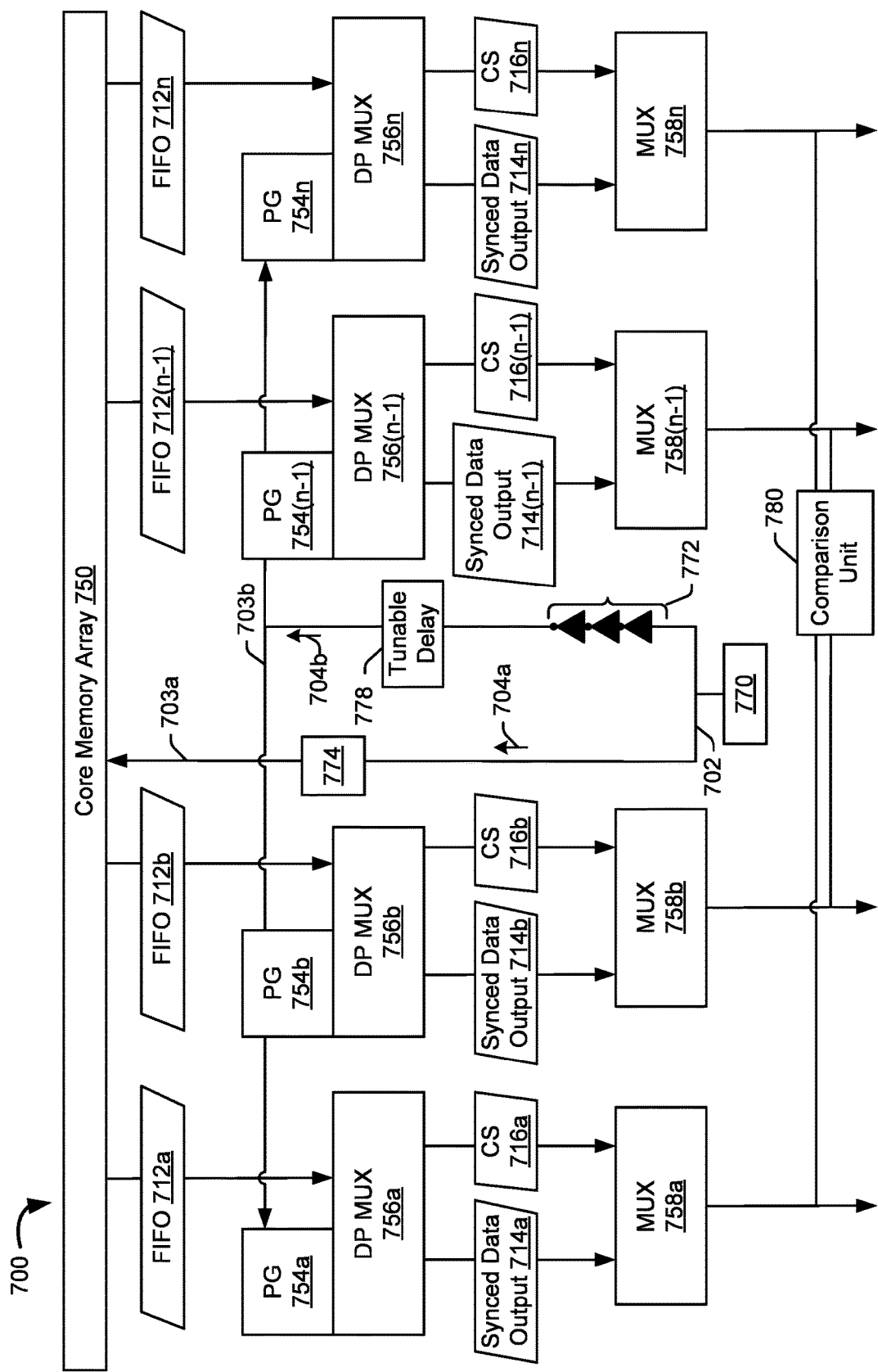
FIG. 7 is a schematic diagram of an data path architecture according to example embodiments of the disclosed technology.

FIG. 7 depicts an improved data path architecture 700 according to embodiments of the disclosed technology. The improved data path architecture 700 of FIG. 7 provides a synchronized data output with some initial invalid data that can be compensated for at a controller side by, for example, adjusting RE latency, so that only valid data is ultimately provided to a downstream component such as an I/O interface. As a result, the data path architecture 700 is scalable across different products/product generations with different clock signal delay differences without requiring modifications to the hardware blocks of the architecture such as changes to the FIFO depth and/or changes to the number of clock delay stages, and as such, constitutes a technical improvement over the data path architecture 600 of FIG. 6. More specifically, the data path architecture 700 is scalable because variation in the number of initial bytes of invalid data in the data output, which in turn, is due to variation in the clock signal delay difference across different product/product generations can be compensated for by the controller via adjustments to RE latency without having to make any physical modifications to the NAND memory itself.

In some embodiments, the architecture 700 includes a core memory array 750 which may store data, similar to the memory array core 650. Data may be read from the core 750 and stored in first-in-first-out (FIFO) buffers 712a-712n (at times collectively referred to herein as first FIFO 712a-712n, or more generically, as first FIFO 712). The first FIFO 712a-712n may, for example, constitute a global FIFO. More specifically, a clock generator 770 such as an read enable (RE) pad or component may generate a clock signal 702. The clock signal 702 may be split into a data path clock signal 703a that travels along a first clock path 704a and a high-speed clock signal 703b that travels along a second clock path 704b.

In some embodiments, a clock generator 774 may be provided to generate the data path clock signal 703a from the input clock signal 702. In particular, the portion of the input clock signal 702 that is split along the first clock path 704a may be the same high-speed clock signal 703b that travels along the second clock path 704b, until the signal reaches the clock generator 774, at which point, the clock generator 774 may generate the data path clock signal 703a from the high-speed clock signal 703b. Further, the clock generator 774 may be configured to tune the data path clock signal 703a to provide better margin inside the core memory array 750. The first FIFO 712a-712n may receive, from the core memory array 750, data that is synchronized with the data path clock signal 703a. In particular, the data path clock signal 703a may read data from the core array 750, and the read data (which is synchronized with the data path clock signal 703a) may be sent to the first FIFO 712a-712n, which in turn, may flush the received data on to data pipeline multiplexers (MUXes) 756a-756n.

The combination of pointer generators 754a-754n and data pipeline MUXes 756a-756n may together constitute FIFO buffers (referred to at times herein as a second FIFO). As noted, the first FIFO 712a-712n receives data that is read from the core memory array 750 and flushes the data—which is synchronized with the data path clock signal 703a—to the data pipeline MUXes 756a-756n. In addition, the high-speed clock signal 703a travelling along the second clock path 704b may be fed to pointer generators 754a-754n. The pointer generators 754a-754n are configured to generate pointers based on the high-speed clock signal 703b, and the pointers may serve as MUXing signals that enable the data pipeline MUXes 756a-756n to select, as synced data outputs 714a-714n, those inputs that are synchronized with respect to the high-speed clock signal 703b, among the multiple inputs received from the first FIFO 712a-712n.

The data path architecture 700 differs from the architecture 600 with respect to the hardware blocks, for example. More specifically, the hardware blocks of the architecture 700 include pointer generators 754a-754n and data pipeline MUXes 756a-756n, but do not include delay stages similar to the delay stages 652a-652n of the architecture 600. Moreover, while the architecture 700 may include some delay stages (e.g., delay stages 772), these delay stages are fixed, in contrast to the delay stages 672, which are variable across different products/product generations. The architecture 700 does not require a variable number of delay stages to satisfy the second FIFO depth (as is required in the architecture 600) because, in the data path architecture 700, the delay difference between the data path clock signal 703a and the high-speed clock signal 703b is not absorbed within a depth of the second FIFO. Rather, the second FIFO is permitted to immediately flush data, including potentially invalid initial byte(s), upon receipt of the high-speed clock signal 703b, and the delay difference is addressed at the controller side by, for example, adjusting the RE latency to discard/ignore the initially invalid bytes. As such, in the data path architecture 700, because the FIFO depth is not used to absorb the clock signal delay difference, there is no need to modify the architecture 700 in any way (e.g., change the depth of the second FIFO) to accommodate variation in the delay difference across different products/product generations. Thus, the FIFO depth can be fixed, and as a result, there is no need to introduce a variable amount of delay to the high-speed clock signal 703b to account for changes to the FIFO depth, as would be required in the data path architecture 600.

As previously noted, upon receipt of the high-speed clock signal 703b and generation of the pointers that serve as the MUXing signals, the data pipeline MUXes 756a-756n may flush data read out from the core memory array 750 and received via the first FIFO 712a-712n. This flushed data output is referred to as synced data output 714a-714n because the output is synchronized with respect to clock signals 716a-716n, which may correspond to the high-speed clock signal 703b or delayed versions thereof due to the delay stages 772, for example. The synced data output 714a-714n may then be fed to MUXes 758a-758n. While the synced data output 714a-714n may be synchronized with respect to clock signals 716a-716n (e.g., high-speed clock signal 703b), the data output 714a-714n may not be synchronized with respect to the data path clock signal 703a, and thus, may include initial invalid data. A controller (e.g., controller 122 of the memory system 100) may compensate for the delay difference between the data path clock signal 703a and the high-speed clock signal 703b in order to ensure that the initial invalid data is discarded/ignored and that only valid data is output by the architecture 700.

More specifically, in some embodiments, the controller may Thus, rather than compensating for the delay difference between the data path clock signal 703a and the high-speed clock signal 703b using the depth of the first FIFO 712a-712n and/or the depth of the second FIFO, and potentially varying the number of delay stages to satisfy the FIFO depth, as the architecture 600 does, the architecture 700 flushes data from the data pipeline MUXes 756a-756n without compensating for the delay difference and without regard for whether invalid data is being flushed, and instead relies on the controller to determine an amount of invalid data to be discarded/ignored at the beginning of the output 714a-714n. In some embodiments, the controller may determine the amount of invalid data based on the invalid data having a predetermined bit sequence and/or based on a predetermined byte sequence that is indicative of the beginning of the valid data.

In some embodiments, the controller may compensate for the delay difference between the data path clock signal 703a and the high-speed clock signal 703b within a software/firmware interface rather than within hardware components of the architecture 700. For instance, the controller may absorb the clock signal delay difference into RE latency or a similar variable of the controller. Since the controller can adjust RE latency by different amounts in order to compensate for different clock signal delay differences across different products/product generations and the resultant differences in the amount of initial invalid data in the data output 714a-714n, the architecture 700 and its corresponding method of operation are highly scalable. Furthermore, the free flow permitted by the architecture 700 (e.g., flushing of data by the second FIFO without compensating for the delay difference between the data path clock signal 703a and the high-speed clock signal 703b) enables the architecture 700 to generate the data output 714a-714n without the need to prefetch data from the core memory array 750 and pre-populate the second FIFO with the pre-fetched data.

The lack of a need to explicitly synchronize the data path clock signal 703a and the high-speed clock signal 703b within the architecture 700 may provide additional benefits beyond scalability. For example, the architecture 700 eliminates the need to absorb a delay difference between the data clock signal 703a and the high speed clock signal 703b within a depth of the second FIFO, and thus, reduces a corresponding number of delay stages along the high-speed clock path 704b, which can improve various signal characteristics such as reducing jitter in the high speed clock signal 703b and reducing energy consumption by virtue of having less delay stages.

In addition, in example embodiments of the disclosed technology, a training algorithm may be executed to train an amount of a tunable delay to introduce to the high-speed clock signal 703b in order to tweak an internal margin with respect to the input to the data pipeline MUXes 756a-756n. The training algorithm may employ a comparison unit 780 to perform a comparison between a data pattern that is generated by the first FIFO 712a-712n based on an input seed and flushed to the data pipeline MUXes 756a-756n and a data pattern generated by the comparison unit 780 based on the same input seed. The comparison unit 780 may determine an amount of tunable delay 778 to introduce to the high-speed clock signal path 704b based on a deviation (if any) between the two data patterns generated from the same input seed. The tunable delay may be introduced by a tunable delay circuit 778. This tunable delay may be refined over multiple iterations of the comparison performed by the comparison unit 780.

Figure 8:
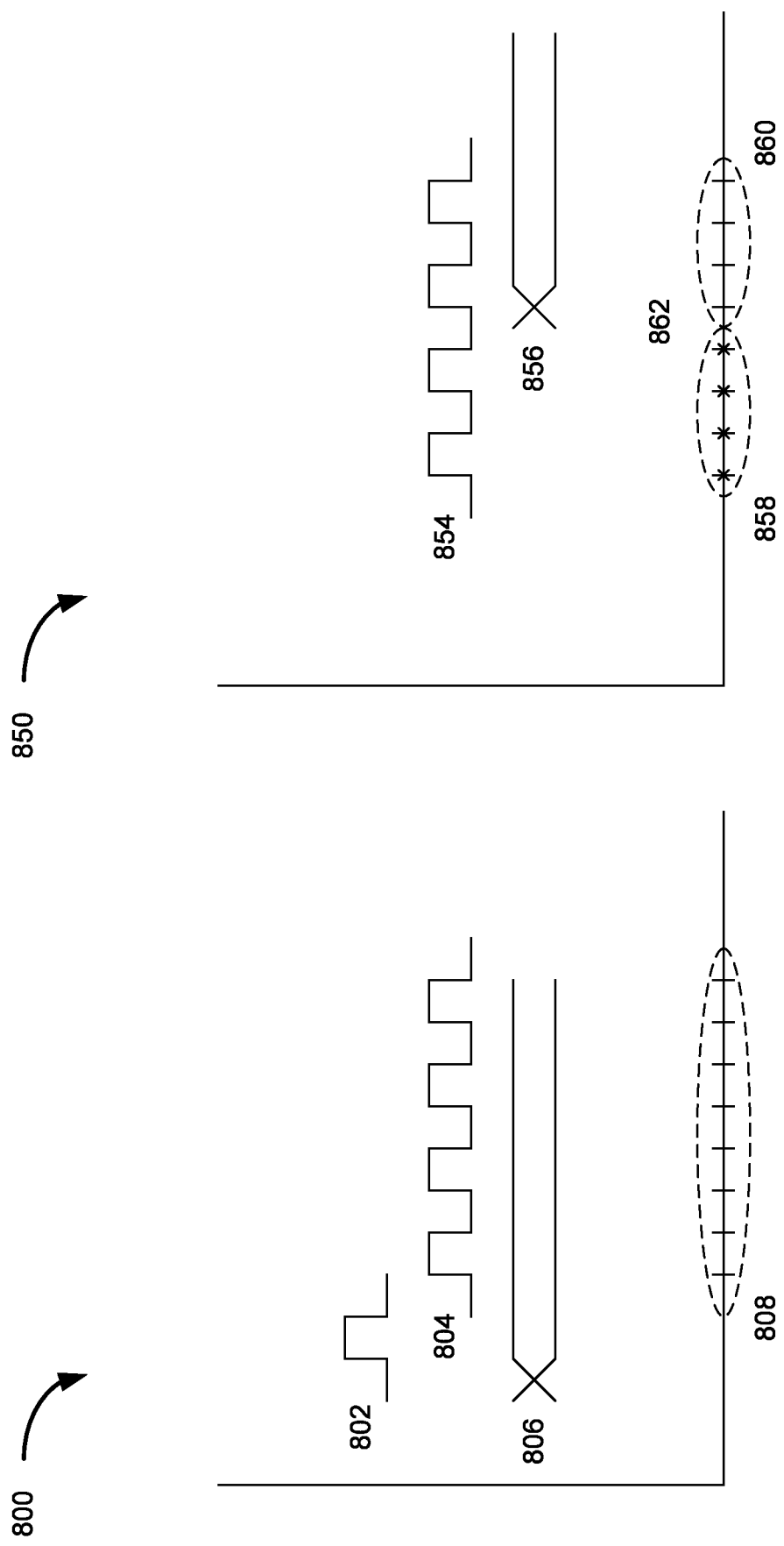
FIG. 8 is a timing diagram illustrating differences between methods of operations of the data path architecture of FIG. 6 and the data path architecture of FIG. 7.

FIG. 8 depicts timing diagrams 800 and 850 illustrating differences in the methods of operations of the architecture 600 of FIG. 6 and the architecture 700 of FIG. 7. The timing diagram 800 corresponds to the architecture 600 and the timing diagram 850 corresponds to the architecture 700. Referring first to the timing diagram 800, a pre-fetch signal 802 is shown. The pre-fetch signal 802 may cause data to be pre-fetched from the core memory array 650 and populated in the stages of the second FIFO. The populating of the second FIFO with pre-fetched data is illustrated by a data valid window 806. In particular, data from the core memory array 650 is pre-fetched and the second FIFO is populated with the pre-fetched data in order to absorb a delay difference between the data path clock signal 603*a* and a high-speed clock signal 804 (which may correspond to high-speed clock signal 603*b*) within a depth of the second FIFO, which may potentially also include varying a number of delay stages in the high-speed clock path 604*b* to satisfy the FIFO depth, thereby resulting in data output 808 (which may correspond to synced data output 614*a*-614*n*) containing only valid data.

In contrast, the timing diagram 850 corresponding to the improved architecture 700 disclosed herein does not include a pre-fetch signal because the architecture 700 does not absorb the clock signal delay difference within the FIFO depth, and thus, there is no need to pre-fetch data from the core memory array 750 and pre-populate the stages of the second FIFO. Rather, as previously described, the data pipeline MUXes 756*a*-756*n* flush the read data responsive to receipt of a high-speed clock signal 854 (which may correspond to the high-speed clock signal 703*b*), without having to compensate for the clock signal delay difference within the data path architecture itself. As such, in some embodiments, the flushed data includes some initial invalid data 858 prior to the valid data 860 appearing, as indicated by the data valid window 856. A controller may compensate for a delay difference between the data path clock signal 703*a* and the high-speed clock signal 856 (i.e., high-speed clock signal 703*b*) by, for example, adjusting RE latency so that the initial invalid data 858 is discarded/ignored, and only valid data is ultimately output from the data path architecture 700.

In some embodiments, the controller may identify the invalid data 856 based on the invalid data 856 having a predetermined sequence of bytes (e.g., all zeros). Further, in some embodiments, the controller may recognize that the invalid data 858 has ended and the valid data 860 has begun based on the appearance of a particular byte sequence. Upon determining the amount of the invalid data 858, the controller may adjust the RE latency to cause the invalid data 858 to be discarded/ignored, thereby indirectly accounting for the delay difference between the data path clock signal 703*a* and the high-speed clock signal 703*b*, and ensuring that only the valid data 860 is output from the data path architecture 700.

Figure 9:
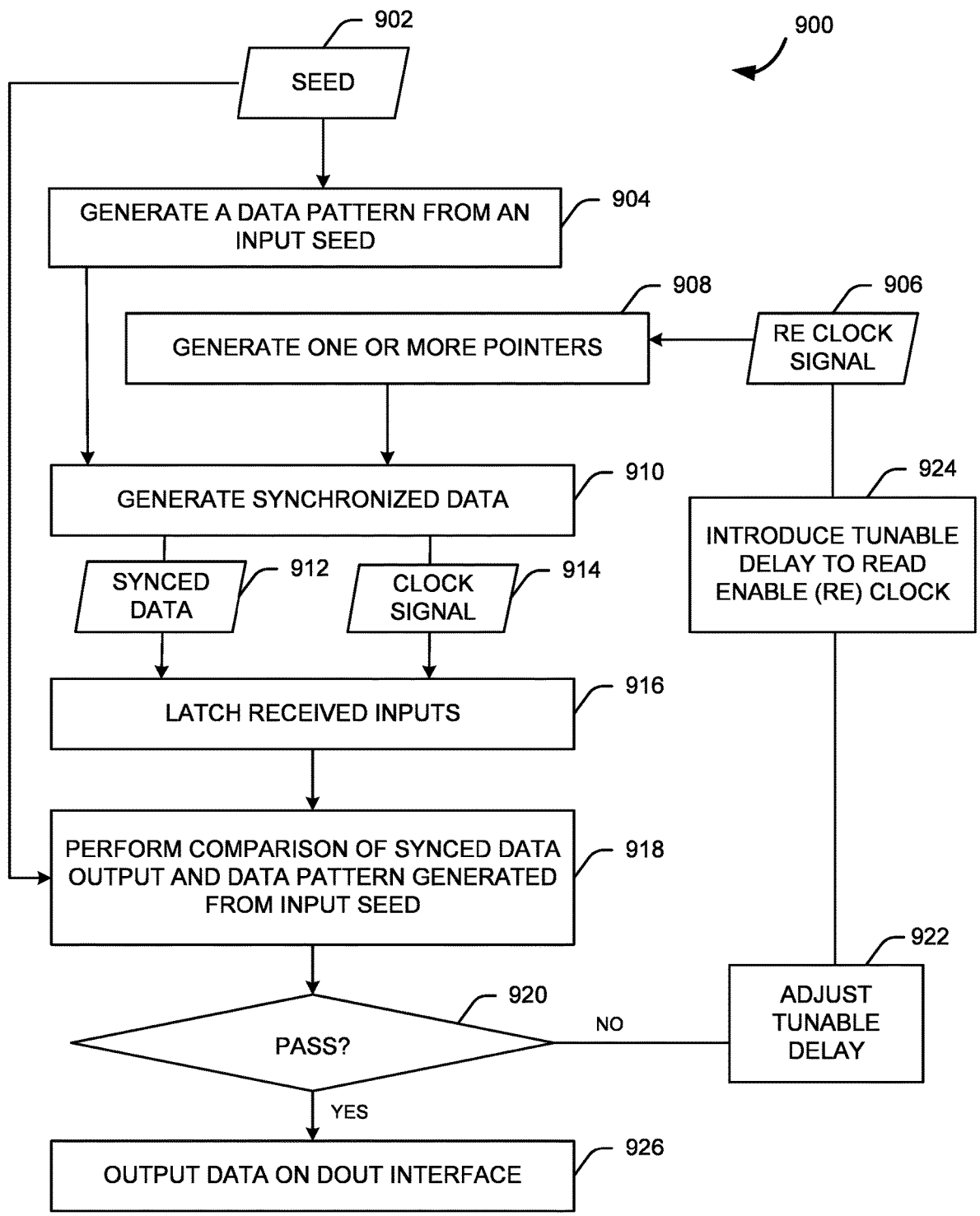
FIG. 9 is a flow diagram of an example training algorithm for determining an amount of tunable delay to introduce to a high-speed clock signal to improve internal margins according to example embodiments of the disclosed technology.

FIG. 9 is a flow diagram of an example training algorithm 900 for determining an amount of tunable delay to introduce to a high-speed clock signal (e.g., high-speed clock signal 703*b*) to improve internal margins according to example embodiments of the disclosed technology. More specifically, the tunable delay may be used to shift pointers generated by the pointer generators 754*a*-754*n* to ensure that margins are aligned and that no data is missed when the data pipeline MUXes 756*a*-756*n* flush out the data output 714*a*-714*n* upon receipt of the high-speed clock signal 703*b*. In some embodiments, the training algorithm 900 may be performed by a controller, such as the controller 102 of FIG. 1.

Referring now to the operations of the training algorithm 900, at block 904, the first FIFO 712*a*-712*n* may generate a unique data pattern based on an input seed 902. This generated data pattern may then be provided to the data pipeline MUXes 756*a*-756*n*. At block 908, the pointer generators 754*a*-754*n* may generate pointers (e.g., MUXing signals) based on an RE clock signal 906, which may be the high-speed clock signal 703*b*. At block 910, the data pipeline MUXes 756*a*-756*n* may utilize the pointers received from the pointer generators 754*a*-754*n* to obtain synchronized data from the data received from the first FIFO 712*a*-712*n*, which it may output as synced data 912 that is synchronized with clock signal 914. Then, at block 916, the synced data 912 may be latched. In example embodiments, the synced data 912 may include the unique data pattern generated by the first FIFO 712*a*-712*n* based on the input seed 902.

At block 918, the comparison unit 780 may be provided with the same input seed 902 that was provided to the first FIFO 712*a*-712*n* and may generate a data pattern based thereon. The comparison unit 780 may then perform a comparison of the data pattern it generates to the data pattern generated by the first FIFO 712*a*-712*n*. If they match, a positive determination may be made at block 920, and the data path architecture may output the synced data 912 on a DOUT interface (e.g., output the synced data 912 on an I/O interface). If the comparison unit 780 determines that the data patterns do not match, on the other hand, a negative determination may be made at block 920, and the tunable delay may be adjusted at block 922 based on deviation between the two data patterns generated from the same input seed 902. The tunable delay circuit 778 may introduce this adjusted tunable delay to the RE clock signal (e.g., high-speed clock signal 703*b*) at block 924, and the RE clock signal 906 with the tunable delay introduced thereto may be provided to the pointer generators 754*a*-754*n* so that the margins of the pointers can be adjusted in accordance with the tunable delay 778. The training algorithm 900 may be performed iteratively until a tunable delay is determined that causes the comparison performed by the comparison unit 780 to pass, which indicates that the pointer margins are aligned and that no data read out from the core memory array 750 is missed when the data pipeline MUXes 756*a*-756*n* flush the synced data 912.

In some embodiments, the training algorithm 900 may be employed for high-speed operations. In particular, the training algorithm 900 may be used to recover from a data valid window (DVW) loss and/or a data byte miss that may be caused by discrepancies between a data clock signal and a high-speed clock signal. In some embodiments, the training algorithm 900 may not be employed at slow speed operation, where the DVW is very large, for example.

Figure 10:
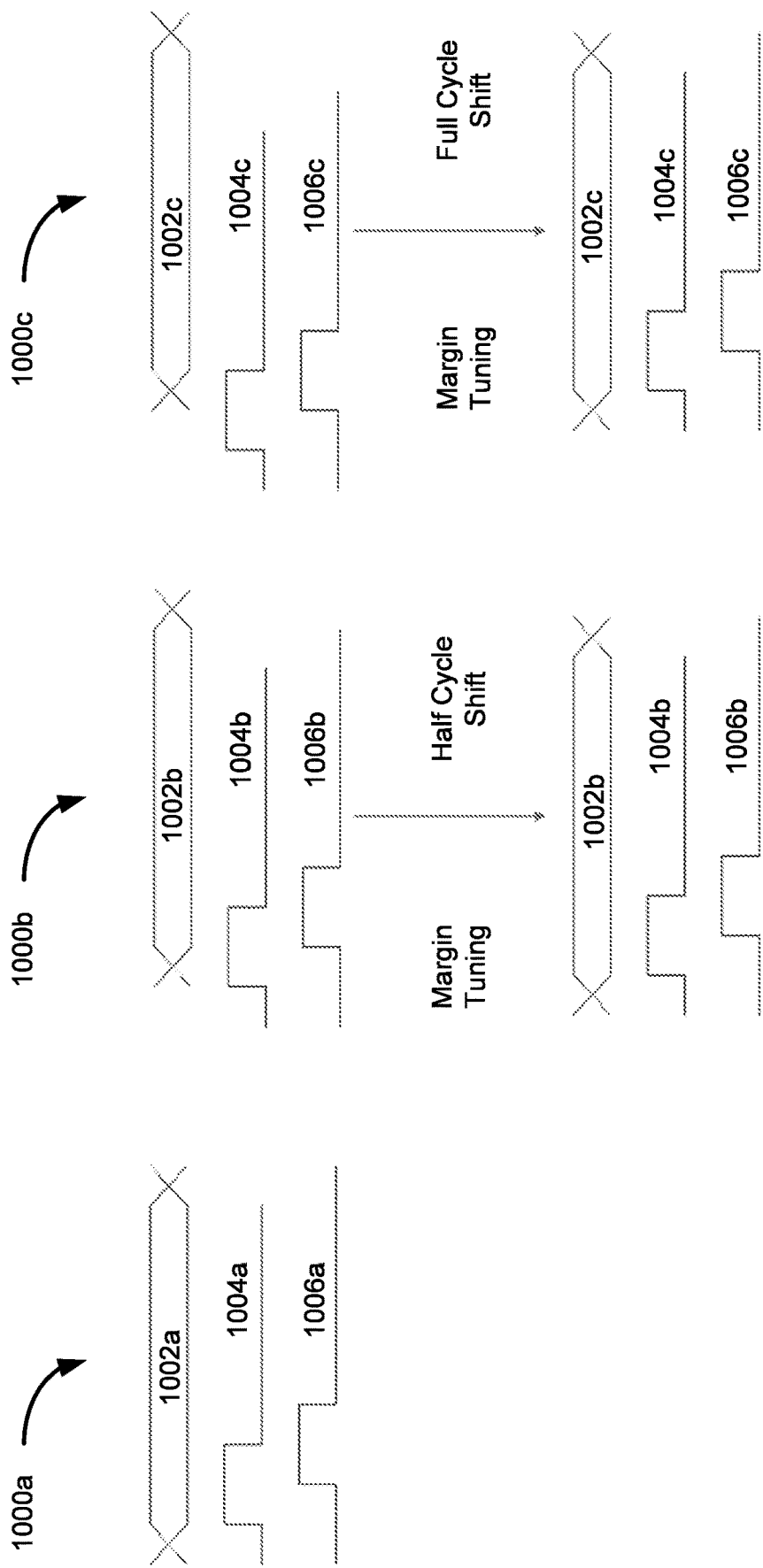
FIG. 10 is an example timing diagram illustrating introduction of a tunable delay to the high-speed clock signal using the training algorithm of FIG. 9.

FIG. 10 depicts example timing diagrams 1000*a*-1000*c* that illustrate application of a tunable delay determined based on the training algorithm of FIG. 9. The timing diagrams 1000*a*-1000*c* correspond to different conditions/circumstances under which the tunable delay may be introduced. The tunable delay may be injected into the high-speed clock path 704*b* using the tunable delay circuit 778 shown in FIG. 7.

The timing diagram 1000*a* corresponds to an instance where a data valid window 1002*a* occurs before a first pointer 1004*a* and a second pointer 1006*a* are generated. As shown, the data valid window 1002a is populated before either of the first and second pointers 1004a, 1006a transition to a logic high state. Thus, the pointers 1004a, 1006a may be considered to be within a margin of the data valid window 1002a, and no tunable delay may be introduced.

The timing diagram 1000b corresponds to an instance where a data valid window 1002b occurs while a first pointer 1004b is generated and before a second pointer 1006b is generated. In this scenario, if data is flushed out in accordance with a rising edge of the pointer 1004b, for example, there is the potential for data loss because the data valid window 1002b is not aligned with a rising edge of the pointer 1004b. In such a scenario, a tunable delay of a half-cycle may be introduced to the first and second pointers 1004b, 1004b. After introduction of this half-cycle delay, the pointers 1004b, 1006b may be within margin of the data valid window 1002b and no data loss may occur.

The timing diagram 1000c corresponds to an instance where a data valid window 1002c occurs after a first pointer 1004c is generated and while a second pointer 1006c is generated. In this scenario, a tunable delay of a full cycle may be introduced to the first and second pointers 1004c, 1004c. After introduction of this full-cycle delay, the pointers 1004c, 1006c may be within margin of the data valid window 1002c and no data loss may occur.

In example embodiments, a controller, such as the controller 102 or an external controller, can fetch, decode, and/or execute one or more stored instructions for performing a method of operation of the data path architecture 700. Such instructions can be stored in a non-transitory storage medium of controller 102 and/or in control logic circuitry 112. As used herein, the term "non-transitory" does not encompass transitory propagating signals. Non-transitory media may comprise non-volatile media and/or volatile media. Non-volatile media includes, for example, optical or magnetic disks. Volatile media includes dynamic memory. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same. As described in detail below, the machine-readable storage medium of controller 102 may be encoded with executable instructions, for example, instructions for executing a method of operation of the data path architecture 700. Non-transitory media is distinct from but may be used in conjunction with transitory media such as transmission media. Transmission media participates in transferring information between non-transitory media. For example, transmission media includes coaxial cables, copper wire and fiber optics, including the wires that comprise bus between the controller and a host. Transmission media can also take the form of acoustic or light waves, such as those generated during radio-wave and infra-red data communications.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A method, comprising:
   receiving, into a data buffer of a data path architecture and based on a data path clock signal, data stored in a memory array;
   receiving a high-speed clock signal; and
   flushing the data from the data buffer responsive to receiving the high-speed clock signal, wherein the flushed data includes one or more bytes of invalid data based on a delay difference between the high-speed clock signal and the data path clock signal, and wherein a controller-side delay is introduced to cause the one or more bytes of invalid data to be ignored or discarded from the flushed data prior to outputting the data from the data path architecture.

2. The method of claim 1, wherein the controller-side delay is an increase in read enable (RE) latency.

3. The method of claim 1, further comprising:
generating, by a clock generator, a clock signal; and
splitting the clock signal into a first signal that travels along a first clock path and a second signal that travels along a second clock path,
wherein the first clock path leads to the memory array and the second clock path leads to the data buffer.

4. The method of claim 3, wherein the clock generator is a first clock generator, the method further comprising:
generating, by a second clock generator provided in the first clock path, the data path clock signal from the first signal.

5. The method of claim 1, wherein the data buffer is a second first-in-first-out (FIFO), and wherein receiving the data stored in the memory array into the second FIFO comprises receiving the data into the second FIFO via a first FIFO.

6. The method of claim 1, further comprising:
executing a training algorithm to determine a tunable delay for adjusting internal margins within data buffer; and
introducing the tunable delay to the high-speed clock signal prior to the high-speed clock signal being received at the data buffer.

7. The method of claim 6, wherein executing the training algorithm comprises:
receiving, at a comparison unit and via the data buffer, a first data pattern generated based on an input seed;
receiving, at the comparison unit, the input seed;
generating, at the comparison unit, a second data pattern based on the received input seed;
comparing, by the comparison unit, the first data pattern and the second data pattern; and
determining the tunable delay based on the comparing.

8. The method of claim 7, wherein executing the training algorithm further comprises:
adjusting an amount of the tunable delay based on a deviation between the first data pattern and the second data pattern.

9. The method of claim 7, further comprising:
performing the training algorithm iteratively until the first data pattern matches the second data pattern.

10. The method of claim 7, wherein the data buffer is a second data buffer, and wherein executing the training algorithm further comprises:
generating, at a first data buffer, the first data pattern based on the input seed; and
receiving the first data pattern into the second data buffer via the first data buffer.

11. A data path architecture, comprising:
a clock generator configured to generate a clock signal that is split into a data path clock signal and a high-speed clock signal; and
a data buffer configured to:
receive data stored in a memory array, wherein the received data is synchronized with the data path clock signal;
receive the high-speed clock signal; and
flush the received data responsive to receiving the high-speed clock signal,
wherein the flushed data includes one or more bytes of invalid data based on a delay difference between the high-speed clock signal and the data path clock signal, and
wherein a controller-side delay is introduced to cause the one or more bytes of invalid data to be ignored or discarded from the flushed data prior to outputting the data from the data path architecture.

12. The data path architecture of claim 11, wherein the controller-side delay is an increase in read enable (RE) latency.

13. The data path architecture of claim 11, further comprising:
a first clock path along which the data path clock signal travels to the memory array; and
a second clock path along which the high-speed clock signal travels to the data buffer.

14. The data path architecture of claim 13, wherein the clock generator is a first clock generator, the architecture further comprising:
a second clock generator provided in the first clock path, wherein the second clock generator is configured to generate the data path clock signal from the clock signal.

15. The data path architecture of claim 11, wherein the data buffer is a second first-in-first-out (FIFO), the architecture further comprising:
a first FIFO,
wherein the data stored in the memory array is received at the second FIFO via the first FIFO.

16. The data path architecture of claim 11, wherein the data buffer comprises:
a pointer generator configured to generate one or more pointers; and
a data pipeline multiplexer configured to receive the data synchronized with the data path clock signal and use the one or more pointers as multiplexing signals to select, as the data to be flushed, received data that is synchronized with the high-speed clock signal.

17. The data path architecture of claim 11, further comprising a comparison unit configured to:
execute a training algorithm to determine a tunable delay for adjusting internal margins within data buffer; and
introduce the tunable delay to the high-speed clock signal prior to the high-speed clock signal being received at the data buffer.

18. The data path architecture of claim 17, wherein the comparison unit is configured to execute the training algorithm by:
receiving, via the data buffer, a first data pattern generated based on an input seed;
receiving the input seed;
generating a second data pattern based on the received input seed;
comparing the first data pattern and the second data pattern; and
determining the tunable delay based on the comparing.

19. A method, comprising:
receiving, at a controller, flushed data from a data buffer of a data path architecture;
determining, by the controller, that the flushed data includes one or more initial invalid bytes based at least in part on detecting a predetermined bit sequence indicative of invalid data; and introducing, by the controller, a delay that causes the data path architecture to output the flushed data without the one or more invalid bytes.

20. The method of claim 19, wherein the flushed data is received at the controller responsive to a high-speed clock signal being received at the data buffer, wherein the flushed data comprises the one or more initial invalid bytes due to a delay difference between a data path clock signal and the high-speed clock signal, and wherein the delay introduced by the controller compensates for the delay difference between the data path clock signal and the high-speed clock signal.

\* \* \* \* \*